US012745594B2

(12) United States Patent
Trumper et al.

(10) Patent No.: US 12,745,594 B2
(45) Date of Patent: Sep. 22, 2026

(54) RETICLE EXCHANGE DEVICE WITH RETICLE LEVITATION

(71) Applicant: Massachusetts Institute of Technology, Cambridge, MA (US)

(72) Inventors: David L. Trumper, Plaistow, NH (US); Brij Mohan Bhushan, Norwalk, CT (US)

(73) Assignee: Massachusetts Institute of Technology, Cambridge, MA (US)

( * ) Notice: Subject to any disclaimer, the term of this patent is extended or adjusted under 35 U.S.C. 154(b) by 567 days.

(21) Appl. No.: 18/248,474

(22) PCT Filed: Nov. 12, 2021

(86) PCT No.: PCT/US2021/059099
§ 371 (c)(1),
(2) Date: Apr. 10, 2023

(87) PCT Pub. No.: WO2022/104028
PCT Pub. Date: May 19, 2022

(65) Prior Publication Data

US 2023/0395409 A1 Dec. 7, 2023

Related U.S. Application Data

(60) Provisional application No. 63/113,438, filed on Nov. 13, 2020.

(51) Int. Cl.

| | |
|---|---|
| ***H10P 72/00*** | (2026.01) |
| ***B65G 47/92*** | (2006.01) |
| ***G03F 7/00*** | (2006.01) |
| ***H10P 72/50*** | (2026.01) |
| ***H10P 72/72*** | (2026.01) |

(52) U.S. Cl.
CPC .......... *H10P 72/0606* (2026.01); *B65G 47/92* (2013.01); *G03F 7/70708* (2013.01);
(Continued)

(58) Field of Classification Search
CPC ............. G03F 7/70708; G03F 7/70741; G03F 7/70733; G03F 9/7011; H01L 21/67259; H01L 21/68; H01L 21/6833; B65G 47/92
See application file for complete search history.

(56) References Cited

U.S. PATENT DOCUMENTS

| | | | |
|---|---|---|---|
| 3,735,231 | A | 5/1973 | Sawyer |
| 4,577,959 | A | 3/1986 | Yazaki |

(Continued)

FOREIGN PATENT DOCUMENTS

| | | |
|---|---|---|
| TW | 202004963 | 1/2020 |
| WO | WO 2018/213825 | 11/2018 |

(Continued)

OTHER PUBLICATIONS

Woo et al., "Hysteretic Feedback Control of Electrostatic Levitator for Objects Possessing Large Suspension Area-Airgap Ratio"; Proceedings of Fourth International Conference on Motion and Vibration Control, 1998; 6 pages.

(Continued)

*Primary Examiner* — Deoram Persaud

(74) *Attorney, Agent, or Firm* — Daly, Crowley, Mofford & Durkee, LLP

(57) ABSTRACT

An electrostatic chuck includes electrodes to clamp a workpiece, electrodes to electrostatically levitate and position the workpiece, and sensors to detect position and orientation of the workpiece. Lateral motion of the workpiece relative to the electrostatic chuck can be damped prior to clamping.

25 Claims, 13 Drawing Sheets

(52) U.S. Cl.
CPC .......... *G03F 7/70741* (2013.01); *H10P 72/50* (2026.01); *H10P 72/722* (2026.01)

(56) References Cited

U.S. PATENT DOCUMENTS

| | | | | |
|---|---|---|---|---|
| 5,051,225 | A | 9/1991 | Hommes et al. | |
| 5,708,346 | A | 1/1998 | Schob | |
| 5,789,843 | A | 8/1998 | Higuchi et al. | |
| 6,107,703 | A | 8/2000 | Korenaga | |
| 6,181,040 | B1 | 1/2001 | Schob | |
| 6,271,606 | B1 | 8/2001 | Hazelton | |
| 7,105,836 | B2 | 9/2006 | del Puerto et al. | |
| 7,199,994 | B1 * | 4/2007 | Levinson | G03F 7/70708 361/233 |
| 7,868,488 | B2 | 1/2011 | Lee | |
| 8,551,577 | B2 | 10/2013 | Moren et al. | |
| 9,025,135 | B2 | 5/2015 | Johnson et al. | |
| 10,274,844 | B1 | 4/2019 | Chung et al. | |
| 11,360,400 | B2 | 6/2022 | Trumper et al. | |
| 11,393,706 | B2 | 7/2022 | Zhou et al. | |
| 2001/0019250 | A1 | 9/2001 | Lee | |
| 2003/0030778 | A1 | 2/2003 | Novak | |
| 2003/0067734 | A1 * | 4/2003 | Nakano | H10P 72/72 361/234 |
| 2003/0068215 | A1 | 4/2003 | Mori et al. | |
| 2004/0160132 | A1 | 8/2004 | Carter et al. | |
| 2004/0160203 | A1 | 8/2004 | Carter et al. | |
| 2005/0093502 | A1 | 5/2005 | Poon et al. | |
| 2005/0133167 | A1 | 6/2005 | Camm et al. | |
| 2005/0133732 | A1 | 6/2005 | Ohtomo et al. | |
| 2005/0168076 | A1 | 8/2005 | Hazelton | |
| 2005/0174551 | A1 | 8/2005 | Phillips | |
| 2005/0200826 | A1 | 9/2005 | Schmidt | |
| 2006/0033903 | A1 | 2/2006 | Yuan et al. | |
| 2006/0049700 | A1 | 3/2006 | Moriyama | |
| 2006/0073395 | A1 | 4/2006 | Phillips | |
| 2006/0131967 | A1 | 6/2006 | Lin et al. | |
| 2008/0054838 | A1 | 3/2008 | Butler et al. | |
| 2008/0129977 | A1 | 6/2008 | Nishimura | |
| 2009/0033901 | A1 | 2/2009 | Ito | |
| 2009/0219504 | A1 | 9/2009 | Hirayanagi | |
| 2009/0268191 | A1 | 10/2009 | Sato | |
| 2009/0315413 | A1 | 12/2009 | Iwatani et al. | |
| 2012/0087058 | A1 * | 4/2012 | Hansen | G03F 7/70783 361/234 |
| 2012/0099095 | A1 | 4/2012 | Zhu et al. | |
| 2012/0249991 | A1 | 10/2012 | Hol et al. | |
| 2013/0099095 | A1 | 4/2013 | Parks | |
| 2013/0249324 | A1 | 9/2013 | Gandi et al. | |
| 2014/0111780 | A1 | 4/2014 | Iwase et al. | |
| 2015/0175031 | A1 | 6/2015 | Henderson et al. | |
| 2016/0023356 | A1 | 1/2016 | Hara | |
| 2016/0065043 | A1 | 3/2016 | Lu et al. | |
| 2016/0306285 | A1 | 10/2016 | Huang et al. | |
| 2017/0040868 | A1 | 2/2017 | Noh et al. | |
| 2017/0115580 | A1 | 4/2017 | Zhu et al. | |
| 2019/0164791 | A1 | 5/2019 | Sugita et al. | |
| 2019/0179233 | A1 | 6/2019 | Butler et al. | |
| 2019/0198299 | A1 | 6/2019 | Watanabe et al. | |
| 2020/0027767 | A1 | 1/2020 | Zang et al. | |
| 2020/0083452 | A1 * | 3/2020 | Heymanns | C23C 14/042 |

FOREIGN PATENT DOCUMENTS

| | | |
|---|---|---|
| WO | WO 2019/204692 | 10/2019 |
| WO | WO 2020/094467 | 5/2020 |
| WO | WO 2020/182637 | 9/2020 |

OTHER PUBLICATIONS

Woo et al., "Electrostatic Force Analysis of Electrostatic Levitation System"; SICE '95, Jul. 26-28, 1995; pp. 1447-1452 (6 pages).

Woo et al., "Electric field and force modeling for electrostatic levitation of lossy dielectric plates"; Journal of Applied Physics (108), Nov. 2010; 11 pages.

Niino et al., "Electrostatic Levitation System in Vacuum Condition Aiming at Linear Bearings"; The 6$^{th}$ International Conference on Motion and Vibration Control, Aug. 19-23, 2002; pp. 1071-1076 (6 pages).

Niino et al., "Basic Study for Electrostatic Levitation System in High-Vacuum Condition"; Conference Record of the 2000 IEEE Industry Applications Conference, IEEE, 2000; pp. 682-686 (5 pages).

Jin et al., "Direct Electrostatic Levitation and Propulsion of Silicon Wafer"; IEEE Transactions on Industry Applications, vol. 34, No. 5, Sep./Oct. 1998; pp. 975-984 (10 pages).

Jin et al., "Direct Electrostatic Levitation and Propulsion of Silicon Wafer"; 5$^{th}$ International Symposium on Magnetic Bearings, Aug. 1996; pp. 429-434 (6 pages).

Jin et al., "Electrostatic Silicon Wafer Suspension"; 4$^{th}$ International Symposium on Magnetic Bearings, Aug. 1994; pp. 343-348 (6 pages).

Jin et al., "Electrostatic Levitator for Hard Disk Media"; IEEE Transactions on Industrial Electronics, vol. 42, No. 5, Oct. 1995; pp. 467-473 (7 pages).

Jin et al., "Direct Electrostatic Levitation and Propulsion"; IEEE Transactions on Industrial Electronics, vol. 44, No. 2, Apr. 1997; pp. 234-239 (6 pages).

S. Earnshaw, "On the Nature of the Molecular Forces which regulate the Constitution of the Luminiferous Ether"; Transactions of the Cambridge Philosophical Society, 1848; 16 pages.

Jeon et al., "Electrostatic Suspension of Dielectrics"; IEEE Transactions on Industrial Electronics, vol. 45, No. 6, Dec. 1998; pp. 938-946 (9 pages).

Jeon et al., "Induction motors with electrostatic suspension"; Journal of Electrostatics 45, May 1998; pp. 157-173 (17 pages).

J. Bruning, "Optical Lithography . . . 40 years and holding"; Proceedings of SPIE vol. 6520, 2007; 13 pages.

S. Shah, "Field Wiring and Noise Considerations for Analog Signals"; National Instruments, Apr. 1992; 27 pages.

Cervin et al., "The Jitter Margin and Its Application in the Design of Real-Time Control Systems"; Proceedings of the 10th International Conference on Real-Time and Embedded Computing Systems and Applications, Aug. 2004; 10 pages.

Hosseini et al., "A new formulation of fringing capacitance and its application to the control of parallel-plate electrostatic micro actuators"; Analog Integr Circ Process, 2007; pp. 119-128 (10 pages).

H. Palmer, "The Capacitance of a Parallel-Plate Capacitor by the Schwartz-Christoffel Transformation"; Palmer—Parallel-Plate Capacitor, Electrical Engineering, Mar. 1937; pp. 363-366 (4 pages).

Wright et al., "Manufacturing issues of electrostatic chucks"; Journal of Vacuum Science & Technology B 13(4), Jul./Aug. 1995; pp. 1910-1916 (8 pages).

Tarzwell et al., "High Voltage Printed Circuit Design & Manufacturing Notebook"; Sierra Proto Express, Ver. 1, Nov. 2004; 36 pages.

Lockerbie et al., "Electrostatic Driver Electronics Preliminary Design Document & Test Report"; LIGO, Advanced LIGO UK, Jun. 2006; 13 pages.

Weng et al., "Vibration Control of Flexible Beams Using Sensor Averaging and Actuator Averaging Methods"; IEEE Transactions on Control Systems Technology, vol. 10, No. 4, Jul. 2002; pp. 568-577 (10 pages).

Amick et al., "Evolving criteria for research facilities: Vibration"; Buildings for Nanoscale Research and Beyond, vol. 5933, SPIE, 2005; 13 pages.

Van der Kruk et al., "Towards the practical application of dynamic error budgeting"; Mikroniek, 5.10, 2010; pp. 52-56 (6 pages).

Sadd et al., "Squeeze Film Dampers: Amplitude Effects at Low Squeeze Numbers"; Transactions of the ASME, Nov. 1975; pp. 1366-1370 (5 pages).

Andrews et al., "A comparison of squeeze-film theory with measurements on a microstructure"; Sensors and Actuators A (36), 1993; pp. 79-87 (9 pages).

J. J. Blech, "On Isothermal Squeeze Films"; Journal of Lubrication Technology, vol. 105, Oct. 1983; pp. 615-620 (6 pages).

(56) References Cited

OTHER PUBLICATIONS

Parise et al., "Ortho-planar linear-motion springs"; Mechanism and Machine Theory 36, Aug. 2001; pp. 1281-1299 (19 pages).
W. Arnold, "Positioning and Levitation Media for the Separation of Biological Cells"; IEEE Transactions on Industry Applications, vol. 37, No. 5, Sep./Oct. 2001; pp. 1468-1475 (8 pages).
Jones et al., "Induction motors with electrostatic suspension"; Journal of Applied Physics 60 (4), Aug. 1986; pp. 1247-1252 (7 pages).
Jeon et al., "Variable-capacitance motors with electrostatic suspension"; Sensors and Actuators 75, Feb. 1999; pp. 289-297 (9 pages).
Jeon et al., "Contactless suspension and transportation of glass panels by electrostatic forces"; Sensors and Actuators A 134, 2007; pp. 565-574 (10 pages).
Jeon et al., "Rotary Actuators with Electrostatic Suspension"; $5^{th}$ International Symposium on Magnetic Bearings, Aug. 1996; pp. 411-418 (8 pages).
Van West et al., "Using Haptic Technology to Improve Non-Contact Handling: the "Haptic Tweezer" Concept"; Advances in Haptics, IntechOpen, Apr. 2010; 28 pages.
Van West et al., "Non-Contact Handling of Hard-Disk Media by Human Operator using Electrostatic Levitation and Haptic Device"; Proceedings of the 2007 IEEE/RSJ International Conference on Intelligent Robots and Systems, Oct.-Nov. 2007; pp. 1106-1111 (6 pages).
Van West et al., "Manipulation of Thin Objects Using Levitation Techniques, Tilt Control, and Haptics"; IEEE Transactions on Automation Science and Engineering, vol. 7, No. 3, Jul. 2010; pp. 451-462 (12 pages).
Paradis et al., "Materials properties measurements and particle beam interactions studies using electrostatic levitation"; Materials Science and Engineering R 76, 2014; 53 pages.
Hyers et al., "A Review of Electrostatic Levitation for Materials Research"; High Temperature Materials and Processes Special Issue, vol. 27, No. 6, 2008; pp. 461-474 (14 pages).
Qiu et al., "Six Dimensional Compliance Analysis of Ortho-Planar Springs for a Continuum Manipulator"; Proceedings of the ASME 2014 International Design Engineering Technical Conferences & Computers and Information in Engineering Conference IDETC/CIE 2014, Aug. 2014; 11 pages.
Le et al., "Stability analysis of a time-optimally controlled electrostatic suspension system and suspension experiments in a vacuum"; Proc. IMechE vol. 225, Part C: J. Mechanical Engineering Science, May 2010; pp. 88-100 (13 pages).
Kogelschatz et al., "Dielectric-Barrier Discharges. Principle and Applications"; Journal de Physique IV, Oct. 1997; pp. C4-47-C4-66 (20 pages).
Kogelschatz, "Dielectric-barrier Discharges: Their History, Discharge Physics, and Industrial Applications"; Plasma Chemistry and Plasma Processing, vol. 23, No. 1, Mar. 2003; 46 pages.
Qin et al., "Wafer dependence of Johnsen-Rahbek type electrostatic chuck for semiconductor processes"; Journal of Applied Physics 102, 064901, 2007; 5 pages.
Trumper et al., "Design and Analysis Framework for Linear Permanent-Magnet Machines"; IEEE Transactions on Industry Applications, vol. 32, No. 2, Mar./Apr. 1996; pp. 371-379 (9 pages).
Apex Microtechnology, Inc., "General Operating Considerations"; AN01U REVJ, Oct. 2012; 13 pages.
Apex Microtechnology, Inc., "Driving Capacitive Loads"; AN25U REVG, Oct. 2012; 19 pages.
Massines et al., "Recent advances in the understanding of homogeneous dielectric barrier discharges"; The European Physical Journal Applied Physics 47, 22805, 2009; 10 pages.
Jayawant, "Electromagnetic suspension and levitation"; Reports on Progress in Physics, vol. 44, 1981; 75 pages.
E. Brandt, "Levitation in Physics"; Science Magazine, vol. 243, Jan. 1989; pp. 349-356 (8 pages).
W. Monkhorst, "Dynamic Error Budgeting, a design approach"; Systems & Control, TU Delft, Mar. 2004; 136 pages.
Jabben et al., "Performance Analysis and Design of Mechatronic Systems—Dynamic Error Budgeting—Theory"; Mikroniek—Professional Journal on Precision Engineering, vol. 51, Issue 2, 2011; pp. 5-12 (8 pages).
Van Eijk et al., "The Ultimate Performance in Floor Vibration Isolation—Dynamic Error Budgeting—Practice"; Mikroniek—Professional Journal on Precision Engineering, vol. 51, Issue 2, 2011; pp. 13-19 (7 pages).
Blair et al., "First Demonstration of Electrostatic Damping of Parametric Instability at Advanced LIGO"; Physical Review Letters 118, 151102, Apr. 2017; 7 pages.
Ludois et al., "Macroscale Electrostatic Rotating Machines and Drives: A review and Multiplicative Gain Performance Strategy"; IEEE Journal of Emerging and Selected Topics in Power Electronics, 2020; 22 pages.
H. Levinson, "EUV Lithography: Present and Future" slideshow; Global Foundries, EUV Lithography Workshop 2016, Jun. 2016; 40 pages.
Fu et al., "EUV Lithography: State-of-the-Art Review"; J. Microelectron. Manuf. 2, 19020202, 2019; 14 pages.
B. Arnold, "Shrinking Possibilities—Lithography will need multiple strategies to keep up with the evolution of memory and logic"; IEEE Spectrum, Apr. 2009; 9 pages.
H. Butler, "Position Control in Lithographic Equipment—An Enabler for Current-Day Chip Manufacturing"; Applications of Control, IEEE Control Systems Magazine, Oct. 2011; pp. 28-47 (20 pages).
Chandhok et al., "Compensation of overlay errors due to mask bending and non-flatness for EUV masks"; Proc. of SPIE, vol. 7271, Mar. 2009; 12 pages.
Meisels et al., "EUV Bragg reflectors with photonic superlattices"; Optics Express 32215, vol. 25, No. 26, Dec. 2017; 12 pages.
I. B. Crandall, "The Air-Damped Vibrating System: Theoretical Calibration of the Condenser Transmitter"; Physical Review, vol. XI, No. 6, Dec. 1917; pp. 449-460 (12 pages).
W. E. Langlois, "Isothermal Squeeze Films"; Quarterly of Applied Mathematics, vol. XX, No. 2, Oct. 1961; pp. 131-150 (20 pages).
Griffin et al., "A Study of Fluid Squeeze-Film Damping"; Journal of Basic Engineering, Transactions of the ASME, Jun. 1966; pp. 451-456 (6 pages).
Senjanovic et al., "An Analytical Solution to Free Rectangular Plate Natural Vibrations by Beam Modes—Ordinary and Missing Plate Modes"; Transactions of FAMENA XL-3, 2016; 18 pages.
T. Oomen, "Advanced Motion Control for Precision Mechatronics: Control, Identification, and Learning of Complex Systems"; IEEJ Journal of Industry Applications, vol. 7, No. 2, 2018; pp. 127-140 (14 pages).
Bao et al., "Squeeze film air damping in MEMS"; Sensors and Actuators A 136, Elsevier, 2007; pp. 3-27 (25 pages).
Sol et al., "Prediction and Measurement of the Damping Ratios of Laminated Polymer Composite Plates"; Materials, 13, 3370, Jul. 2020; 24 pages.
A. Slocum, "Kinetic couplings: A review of design principles and applications"; International Journal of Machine Tools & Manufacture 50, 2010; pp. 310-327 (18 pages).
K. Armstrong, "Skin Effect and Surface Currents"; In Compliance Magazine, 2018; 15 pages.
M. Lapedus, "Multi-Patterning EUV Vs. High-NA EUV"; Semiconductor Engineering, Dec. 2019; 13 pages.
Bhushan et al., "Low Cost, High Dynamic Range Position Sensing Enabled by Oversampling and Averaging"; 2020 ASPE Spring Topical Meeting—Design and Control of Precision Mechatronic Systems, May 2020; 6 pages.
Ono et al., "Micro-discharge and electric breakdown in a micro-gap"; J. Micromech. Microeng. 10, 2000; pp. 445-451 (8 pages).
Sogard et al., "Analysis of Coulomb and Johnsen-Rahbek electrostatic chuck performance for extreme ultraviolet lithography"; Journal of Vacuum Science & Technology B 25 (6), Nov./Dec. 2007; 8 pages.
Schmidt, "Ultra-precision engineering in lithographic exposure equipment for the semiconductor industry"; Philosophical Transactions of the Royal Society A, 2012; pp. 3950-3972 (23 pages).
Silicon Labs data sheet, AN118, Rev. 1.3, 2013 (21 pages).

(56) References Cited

OTHER PUBLICATIONS

Kumar et al., "Experimental Study of Electric Suspension for Microbearings"; Journal of Microelectromechanical Systems, vol. 1, No. 1, Mar. 1992; pp. 23-30 (8 pages).
Kumar et al., "A Proposal for Electrically Levitating Micromotors"; Sensors and Actuators A, 24, 1990; pp. 141-149 (9 pages).
PCT International Search Report and Written Opinion dated Aug. 24, 2018, for International Application No. PCT/US2018/033662; 17 pages.
PCT International Search Report and Written Opinion dated Jul. 12, 2019, for International Application No. PCT/US2019/028266; 12 pages.
U.S. Non-Final Office Action dated Sep. 9, 2021, for U.S. Appl. No. 17/047,849; 16 Pages.
Response to U.S. Non-Final Office Action dated Sep. 9, 2021, for U.S. Appl. No. 17/047,849; Response filed on Dec. 21, 2021; 10 Pages.
Preliminary Amendment dated Aug. 30, 2019, for U.S. Appl. No. 16/490,206; 9 Pages.
Restriction Requirement dated Nov. 17, 2021, for U.S. Appl. No. 16/490,206; 7 Pages.
Response to Restriction Requirement dated Nov. 17, 2021, for U.S. Appl. No. 16/490,206; Response filed on Dec. 21, 2021; 1 Page.
PCT International Preliminary Report of Patentability dated Nov. 28, 2019, for International Application No. PCT/US2018/033662; 10 Pages.
PCT International Preliminary Report on Patentability dated Oct. 29, 2020, for International Application No. PCT/US2019/028266; 7 Pages.
U.S. Notice of Allowance dated Feb. 15, 2022, for U.S. Appl. No. 16/490,206; 16 Pages.
U.S. Notice of Allowance dated Mar. 23, 2022, for U.S. Appl. No. 17/047,879; 9 Pages.
Holmes et al. "The long-range scanning stage: a novel platform for scanned-probe microscopy" Precision Engineering Journal of the International Societies for Precision Engineering and Nanotechnology, Jun. 22, 1999, 19 pages.
Jung et al. "Study on a Novel Contact-Free Planar System Using Direct Drive DC Coils and Permanent Magnets", IEEE/ASME Transactions on Mechatronics, vol. 7, No. 2, Mar. 2002, 9 pages.
Kim et al. "High-Precision Control of a Maglev Linear Actuator with Nanopositioning Capability", Proceedings of the American Control Conference Anchorage, AK May 8-10, 2002, 6 pages.
Kim et al. "High-precision magnetic levitation stage for photolithography" Precision Engineering 22:66- 77, Jan. 1998, 12 pages.
Mori et al. "Linear Actuator with Air Bearing for Highly Precise Tracking" IEEE, Jan. 2002, 2 pages.
Verma et al. "Multi-Axis Maglev Nanopositioner for Precision Manufacturing and Manipulation Applications", IEEE Jan. 2004, 8 pages.
Woo et al. "Design and Optimization of Long Stroke Planar Motion Maglev Stage using Copper Strip Array" International Journal of Precision Engineering and Manufacturing vol. 16, No. 3, pp. 479-485, 7 pages.
Zhou, et al. "Position Control for Hysteresis Motors: Transient-time and Field-oriented Control"; IEEE International Electric Machines and Drives Conference (IEMDC); May 2017; 10 Pages.
Zhou, et al. Magnetically Levitated Hysteresis Motor Driven Liner Stage for In-Vacuum Transportation Tasks, Massachusetts Institute of Technology, Ph.D Thesis; 2019; 246 Pages.
U.S. Non-Final Office Action dated Aug. 4, 2023, for U.S. Appl. No. 17/653,661; 7 pages.
Restriction Requirement dated Apr. 20, 2023, for U.S. Appl. No. 17/653,661; 9 pages.
Response to Restriction Requirement dated Apr. 20, 2023, for U.S. Appl. No. 17/653,661; Response filed on Jul. 20, 2023; 1 page.
PCT International Search Report and Written Opinion dated Feb. 3, 2022 for International Application No. PCT/US2021/059099; 12 pages.
Cummings et al., "EUV Defects," International Symposium on Extreme Ultraviolet Lithography, 2009; 16 pages.
H. J. Levinson, "EUV Lithography: Present and Future," International Workshop on EUV Lithography, Jun. 2016; 40 pages.
Wikipedia contributors, "Paschen's law—Wikipedia, The Free Encyclopedia," Oct. 6, 2018, https://en.wikipedia.org/w/index.php?title=Paschen%27s law& oldid=862710166; 9 pages.
Jin et al., "Direct Electrostatic Levitation and Propulsion," IEEE Transactions on Industrial Electronics, vol. 44, No. 2, pp. 234-239, Apr. 1997; 6 pages.
Jin et al., "Direct Electrostatic Levitation and Propulsion of Silicon Wafer," IEEE Transactions on Industry Applications, vol. 34, No. 5, pp. 975-984, Sep./Oct. 1998; 10 pages.
Jin et al., "Electrostatic Levitator for Hard Disk Media," IEEE Transactions on Industrial Electronics, vol. 6, No. 5, pp. 467-473, Oct. 1995; 7 pages.
Jeon et al., "Electrostatic Suspension of Dielectrics," IEEE Transactions on Industrial Electronics, vol. 45, No. 6, pp. 938-946, Dec. 1998; 9 pages.
Response to Office Action dated Aug. 4, 2023, for U.S. Appl. No. 17/653,661, filed Nov. 3, 2023; 8 Pages.
Notice of Allowance dated Nov. 20, 2023, for U.S. Appl. No. 17/653,661; 7 Pages.
Restriction Requirement dated Sep. 5, 2025, for U.S. Appl. No. 18/515,952, 7 pages.
Response to Restriction Requirement dated Sep. 5, 2025, filed on Nov. 5, 2025, for U.S. Appl. No. 18/515,952, 1 page.
Office Action dated Nov. 25, 2025, for U.S. Appl. No. 18/515,952, 18 pages.
Response to Office Action dated Nov. 25, 2025, filed on Jan. 19, 2026, for U.S. Appl. No. 18/515,952, 10 pages.
Final Office Action dated Feb. 27, 2026, for U.S. Appl. No. 18/515,952, 8 pages.

* cited by examiner

RETICLE EXCHANGE DEVICE WITH RETICLE LEVITATION

CROSS REFERENCE TO RELATED APPLICATIONS

This application is a National Stage Entry of International Application No. PCT/US2021/059099, which was filed on Nov. 12, 2021, which claims the benefit of U.S. Provisional Application No. 63/113,438, which was filed on Nov. 13, 2020. The entire contents of these applications are incorporated herein by reference.

BACKGROUND

In photolithography, a reticle is a light filter with a pattern of opaque and transparent sections. The pattern acts as a map that defines at least one layer of a multilayered device, such as an integrated circuit.

During production of the multilayered device such as an integrated circuit, reticles are used to produce layers of the device. A set of reticles, each one defining a different layer of the multi-layered device, are swapped in during different stages of production and used to print circuit patterns on the layers. The swapping process can occur very quickly. Robotic arms and devices that perform the swap operate rapidly to reduce manufacturing time. However, the rapid motion can cause vibration and other motions that wear down the reticle.

In some fabrication machines, an electrostatic chuck is used to pick up and exchange the reticles. The electrostatic attraction between the chuck and the electrically conducting layers on the reticle allows the chuck to clamp the reticle and move it into position for production. However, the act of clamping the reticle can cause wear to the reticle and generate particulates that can interfere with the manufacturing process. These effects can cause defects in production.

Typically, to clamp the reticle, the chuck is aligned with the reticle then moved toward the reticle until contact is made. Electrodes in or on the chuck are then turned on, creating an electrostatic force that clamps the reticle to the surface of the chuck. Misalignment in the position of the reticle relative to the chuck and bowing of the shape of the reticle (e.g. due to gravity) can cause relative motion between the chuck and the reticle as the reticle is clamped. This motion, along with vibrations between the chuck and reticle, can cause wear to the reticle and result in manufacturing defects and increased maintenance costs. One solution to solve clamping vibration is to move the chuck toward the reticle very slowly. However, this solution increases manufacturing time.

Given these challenges, there is a need for new solutions which address the tradeoff between the time for reticle contact and clamping, and particle generation and the wear of the reticle and the electrostatic chuck. It is also desirable to make the reticle transfer a more deterministic process, with contact forces not limited by the relative vibrational motions between the RED arm and the electrostatic chuck.

SUMMARY

Levitating a reticle via an electrostatic field (i.e. lifting the reticle prior to an electrostatic chuck clamping the reticle) can solve or alleviate some or all the problems of misalignment, vibration, wear and tear, added maintenance cost, and increase in manufacturing time. The electrostatic field may also be used to control the trajectory (position, velocity, acceleration, jerk, and higher order dynamics) of the reticle prior to and during the clamping process.

During levitation of the reticle, the position and orientation of the reticle can be controlled with six degrees of freedom. In addition, the reticle can be shaped (e.g. bowed or bent) to reduce stress and wear and tear when contact is made with the chuck. In an embodiment it may be desirable to shape the reticle (e.g. using electrostatic forces) such that the center portion of the reticle makes first contact with the electrode of the electrostatic chuck to reduce particle generation and wear of the reticle by reducing lateral movement of the reticle against the surface of the electrostatic chuck as the electrodes clamp the reticle.

Additionally, since only the reticle is moving relative to the electrostatic chuck, and not other machinery to hold and/or manipulate the reticle, the reticle has a relatively lower momentum due to the low mass of the reticle as compared with the mass of the other machinery. Therefore, for a given relative velocity between the electrostatic chuck and the reticle, the impact forces upon contact can be significantly lower. This can result in less vibration, less lateral movement, and less impact force and stress, all of which can improve clamping position and accuracy of reticle placement, as well as reduce particle generation and wear on the reticle.

The electrostatic field can help to shape the reticle during contact such the reticle contacts the chuck at its center and then flattens out on the surface of the chuck. In other examples, the electrostatic field can twist or bend the shape of the reticle as desired to minimize wear when the reticle makes contact with the chuck. This will minimize relative motion between the chuck and the reticle and thereby reduce reticle wear and particle generation.

With the reticle levitated by an electrostatic field, any horizontal vibration motions of the reticle relative to the electrostatic chuck can be reduced or eliminated before clamping, which can reduce sliding contact, particle generation, and wear at the time of clamping.

In an embodiment a system for exchanging a reticle in a semiconductor processing system includes a reticle exchange device having a seat for a reticle; an electrostatic chuck having one or more electrodes for electrostatically clamping the reticle; and one or more levitation electrodes to electrostatically levitate the reticle prior to clamping by the electrostatic chuck.

One or more of the following features may be included.

The one or more levitation electrodes may be positioned on the electrostatic chuck.

The one or more levitation electrodes may be configured to also act as clamping electrodes.

The electrodes may be configured to control motion trajectory, position, shape, contact location, contact forces, and orientation of the reticle.

The electrodes may be configured to control position and orientation of the reticle with six degrees of freedom.

The electrodes may be configured to shape the reticle so that a center area of the reticle is closer to the electrostatic chuck than one or more corners of the reticle during levitation.

One or more sensors may be included to detect a position and orientation of the reticle.

The one or more sensors and the electrodes may be the same electrodes.

The electrodes may include an electrode to control horizontal positioning of the reticle, an electrode to control vertical positioning of the reticle, and/or an electrode to control a shape of the reticle.

The one or more sensors may be configured to detect the position of and orientation of the reticle in six degrees of freedom and/or detect a shape of the reticle.

The one or more electrodes may be configured to dampen lateral motion of the reticle during levitation.

One or more motors may be coupled to the electrostatic chuck to control a position of the electrostatic chuck; and a control circuit coupled to control the one or more motors.

The control circuit may be configured to dampen lateral motion of the reticle during levitation by controlling the position of the electrostatic chuck.

In another embodiment, an electrostatic chuck includes a surface to receive a workpiece; one or more clamping electrodes to electrostatically attract and clamp the workpiece against the surface; one or more levitation electrodes to electrostatically levitate the workpiece prior to clamping; one or more position sensors to detect a position of the workpiece during levitation; and a circuit coupled to at least one of the one or more clamping electrodes and/or levitation electrodes. The circuit is configured to control levitation and clamping of the workpiece.

One or more of the following features may be included.

The one or more levitation electrodes may be configured to also act as clamping electrodes.

The one or more levitation electrodes may be configured to control motion trajectory, position, and orientation of the workpiece with six degrees of freedom during levitation.

The one or more levitation electrodes may be configured to change a shape of the workpiece so that center area of the workpiece is closer to the surface than an edge and/or corner area of the workpiece.

The one or more sensors may be configured to detect a shape of the workpiece.

The one or more levitation electrodes may be configured to dampen motion of the workpiece during levitation.

One or more motors may be coupled to the electrostatic chuck to control a position of the surface, and a motor control circuit coupled to control the one or more motors.

The motor control circuit may be configured to dampen motion of the workpiece during levitation by controlling the position of the electrostatic chuck.

The circuit may be configured to dampen motion of the workpiece by providing an electronic signal to at least one electrode of the clamping electrodes and/or the levitation electrodes that causes the at least one electrode to create electrostatic forces that reduce a lateral motion of the workpiece.

In another embodiment, a system for exchanging a reticle in a production system includes a reticle exchange device having a seat for a photolithographic reticle; an electrostatic chuck having a surface and one or more electrodes for electrostatically clamping the photolithographic reticle; and means for levitating the photolithographic reticle toward the surface of the chuck.

The system may also include means for damping lateral motion of the reticle prior to clamping by the electrostatic chuck.

In another embodiments, a system for exchanging a photolithographic reticle in a photolithographic production system includes a reticle exchange device having a seat for a photolithographic reticle; an electrostatic chuck having a surface and one or more electrodes for electrostatically clamping the photolithographic reticle; and a levitation system for levitating the reticle toward the surface of the chuck.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
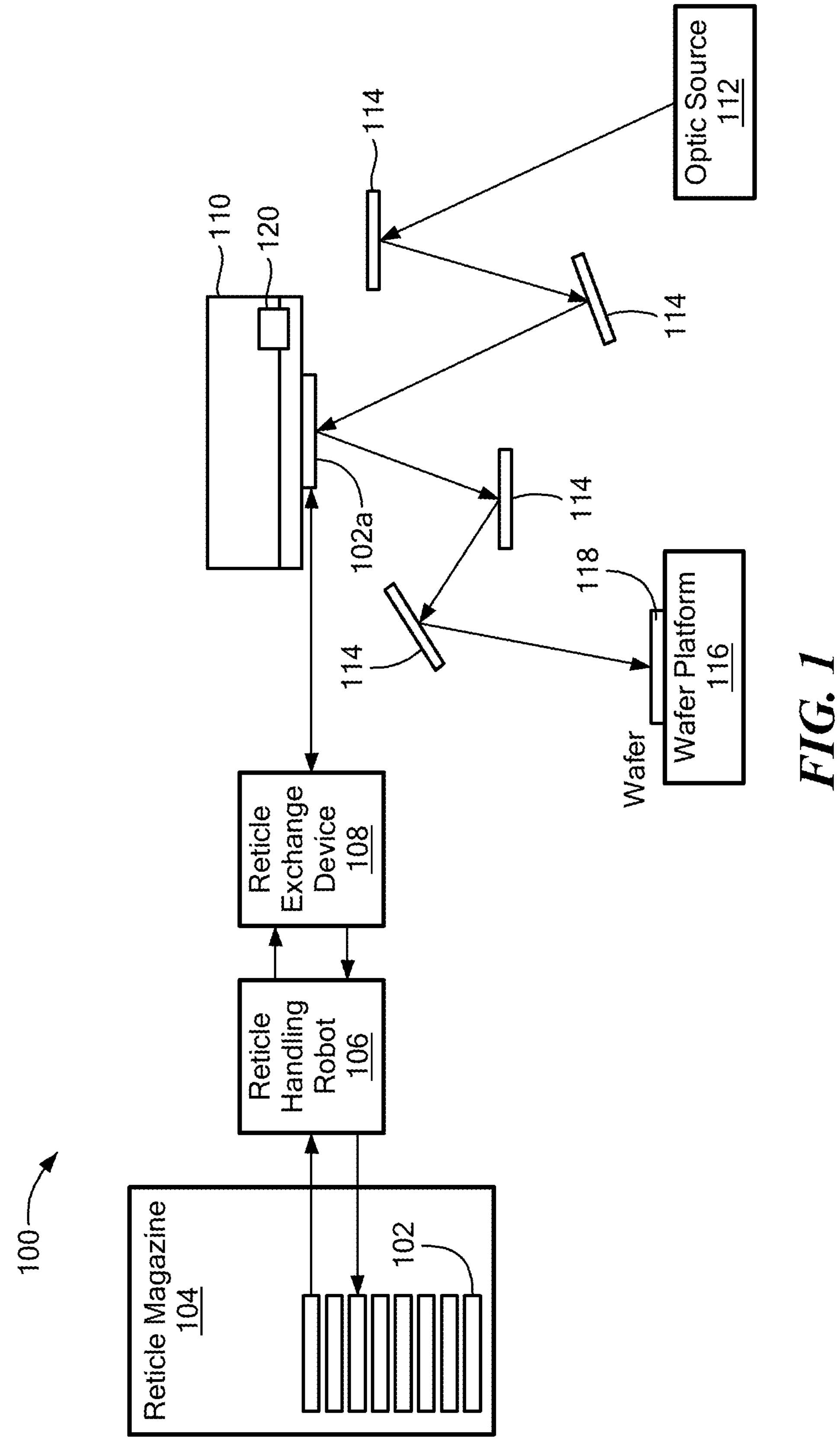
FIG. 1 is a block diagram of a system for photographically manufacturing an integrated circuit, including an electrostatic chuck and reticle.

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which:

FIG. 1 is a diagram of an integrated circuit fabrication system 100 (for example, a photolithographic production system) that includes a reticle exchange system for exchanging photolithographic reticles 102 during fabrication of integrated circuitry or other products that are manufacturing using photolithography. The reticle exchange system includes a reticle magazine 104 for storing the reticles 102, a reticle handling robot 106 for shuttling the reticles 102 to and from the reticle magazine 104, and a reticle exchange device 108 for exchanging the reticles 102 that are being used in the fabrication system. In this example, the reticle exchange device 108 may provide a seat for the reticle, holding it in a position so that the reticle can be picked up by the electrostatic chuck 110.

The fabrication system includes an optical source 112, one or more illumination and projection optics 114 (e.g. filters, mirrors, lenses, and the like), and a wafer platform 116 that holds a wafer 118 during fabrication. The light from optical source 112 is reflected and altered by the projection optics 114 and reticle 102*a* prior to the light reaching wafer 118. Typically, reticle 102*a* provides an optical mask or pattern that defines layers and interconnections that will be formed on wafer 118. Accordingly, to form different layers (or to fabricate different wafers), reticle 102*a* may be swapped out with other reticles from the reticle magazine 104.

To pick up a new reticle, the electrostatic chuck 110 aligns with the reticle exchange device 108. The reticle 102*a* is then levitated up from its seat on the reticle exchange device 108 until it makes contact with the electrostatic chuck 110, at which point the electrostatic chuck 110 clamps the reticle 102*a* in place. The electrostatic chuck 110 then moves to position the new reticle in place among the other projection optics 114, where it is used to fabricate a layer onto the wafer 118.

The electrostatic chuck 110 may include and/or may be coupled to a control circuit 120 that is configured to control movement of the electrostatic chuck 110. The control circuit may drive or receive various electronic signals that can control the electrostatic chuck 110.

The fabrication system 100 shown in FIG. 1 is provided as an example. Fabrication processes and equipment will vary from fabrication system to fabrication system. Regardless of the specific details and operation of the fabrication system, a fabrication system and/or electrostatic chuck that levitates the reticle 102*a* prior to clamping the reticle 102*a* may reduce wear on the reticle and reduce time and errors during the manufacturing process.

FIGS. 2A-2D illustrate the levitation and clamping of a reticle 102*a* in four stages. As shown, the electrostatic chuck 110 may be coupled to a long-stroke motor assembly 202, which may provide gross motor control of the electrostatic chuck 110 to make large, general movements. The electrostatic chuck 110 may be coupled to a housing 204 by one or more short stroke motors 206, which provide fine motor control of the electrostatic chuck 110 to make relatively smaller, fine-tuned adjustments to the chuck's position.

Figure 2A:
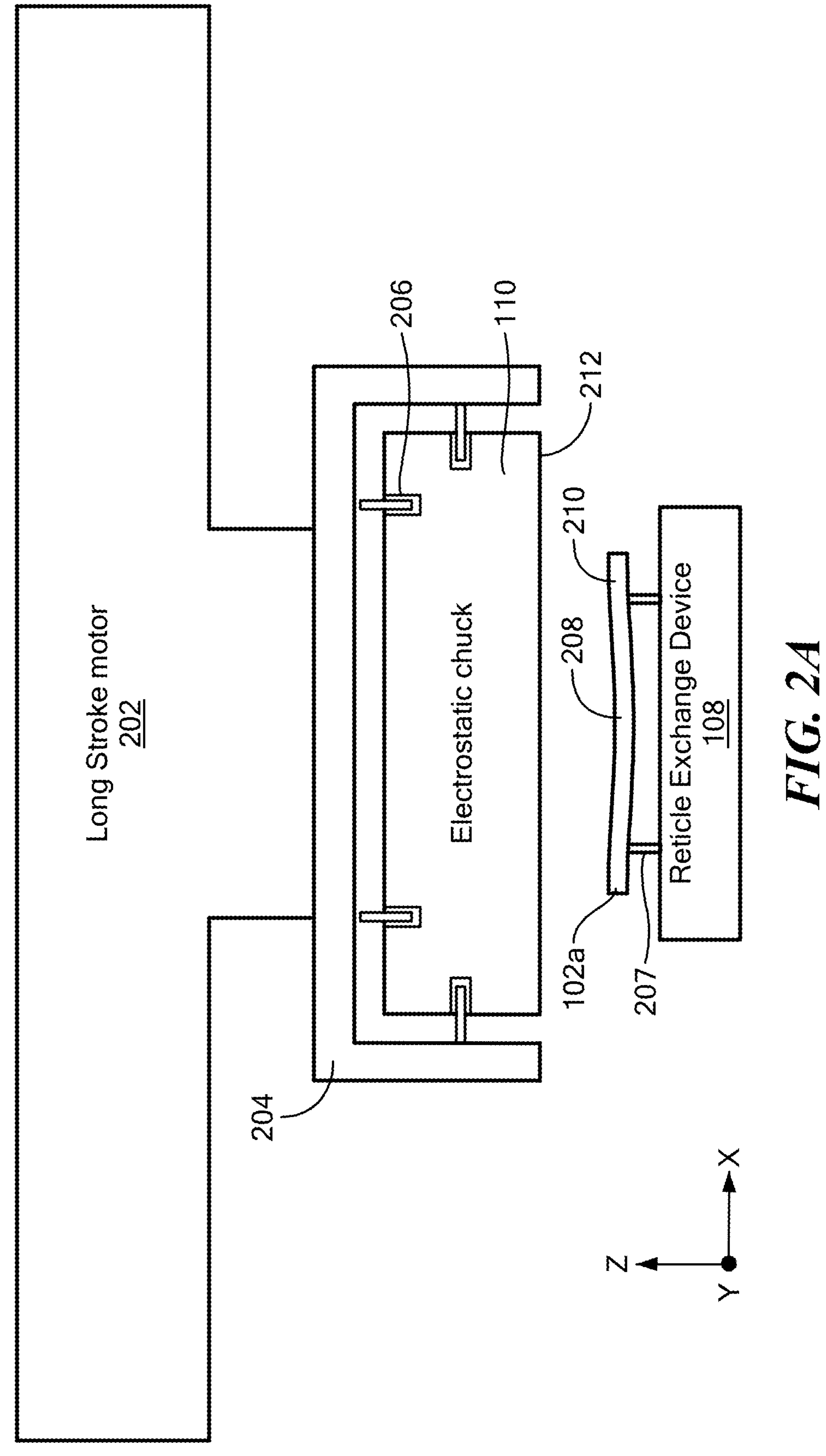
FIGS. 2A, 2B, 2C, and 2D are a series of diagrams illustrating electrostatic levitation of a reticle toward the clamping surface of an electrostatic chuck.
Figure 2B:
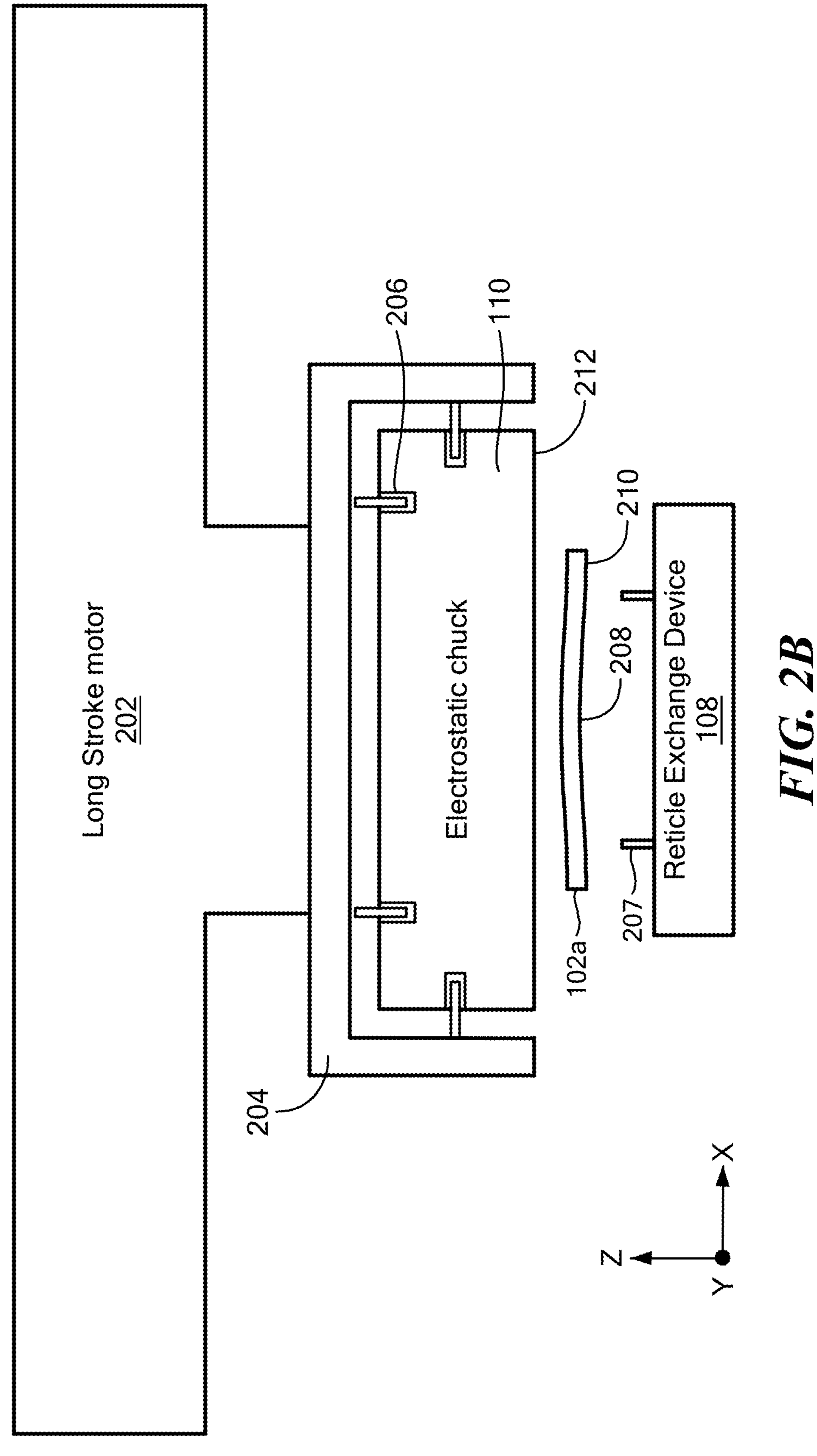

In FIG. 2B, the reticle 102*a* is positioned on a seat 207 of the reticle exchange device 108 and is ready to be picked up and clamped by the electrostatic chuck 110. The shape of the reticle 102*a* may be bowed due to gravity so that a center area 208 of the reticle 102*a* is lower than the edge 210 of the reticle 102*a*. Typically, the center area 208 may be about 1 μm lower than the edges 210. In this position, if the electrostatic chuck 110 were to contact and clamp the reticle 102*a*, the edges 210 of the reticle 102*a* may make first contact with the electrostatic chuck. When the electrostatic chuck 110 clamps the reticle 102*a*, the edges 210 of the reticle 102*a* may slide and scrape against the clamping surface 212 of the chuck, which could cause damage or wear to the reticle 102*a* and/or the electrostatic chuck 110. To reduce such wear and damage, electrodes on the electrostatic chuck 110 may levitate the reticle 102*a* prior to clamping by the electrostatic chuck 110.

In FIG. 2B, the electrodes have levitated reticle 102*a* above the seat 207. When levitating, the shape of the reticle 102*a* may change so that the center area 208 is bowed upward, toward the clamping surface 212 of the electrostatic chuck 110, and the edges 210 of the reticle 102*a* are bowed down, away from the electrostatic chuck 110. In embodiments, this bowing is the result of the force of gravity pulling on the reticle 102*a* in a downward direction while the force of the electrostatic levitation pulls upward on the reticle 102*a*. When the body of the reticle 102*a* is bowed in this position, the center area 208 may contact the surface 212 of the electrostatic chuck 110 before the edges 210. This may reduce wear and tear of the reticle 102*a* and the clamping surface 212 as the electrostatic chuck 110 clamps the reticle 102*a*.

Additionally, while the reticle 102*a* is levitating, the position of the reticle 102*a* may be adjusted in six degrees of freedom so that the reticle 102*a* is aligned with the electrostatic chuck 110. Levitating the reticle 102*a* allows the position of the reticle 102*a* to be precisely and accurately controlled during the clamping process. The precise positioning of the reticle 102*a* prior to clamping reduces unwanted misalignment of the reticle 102*a* which can introduce errors into the fabrication process.

Figure 2C:
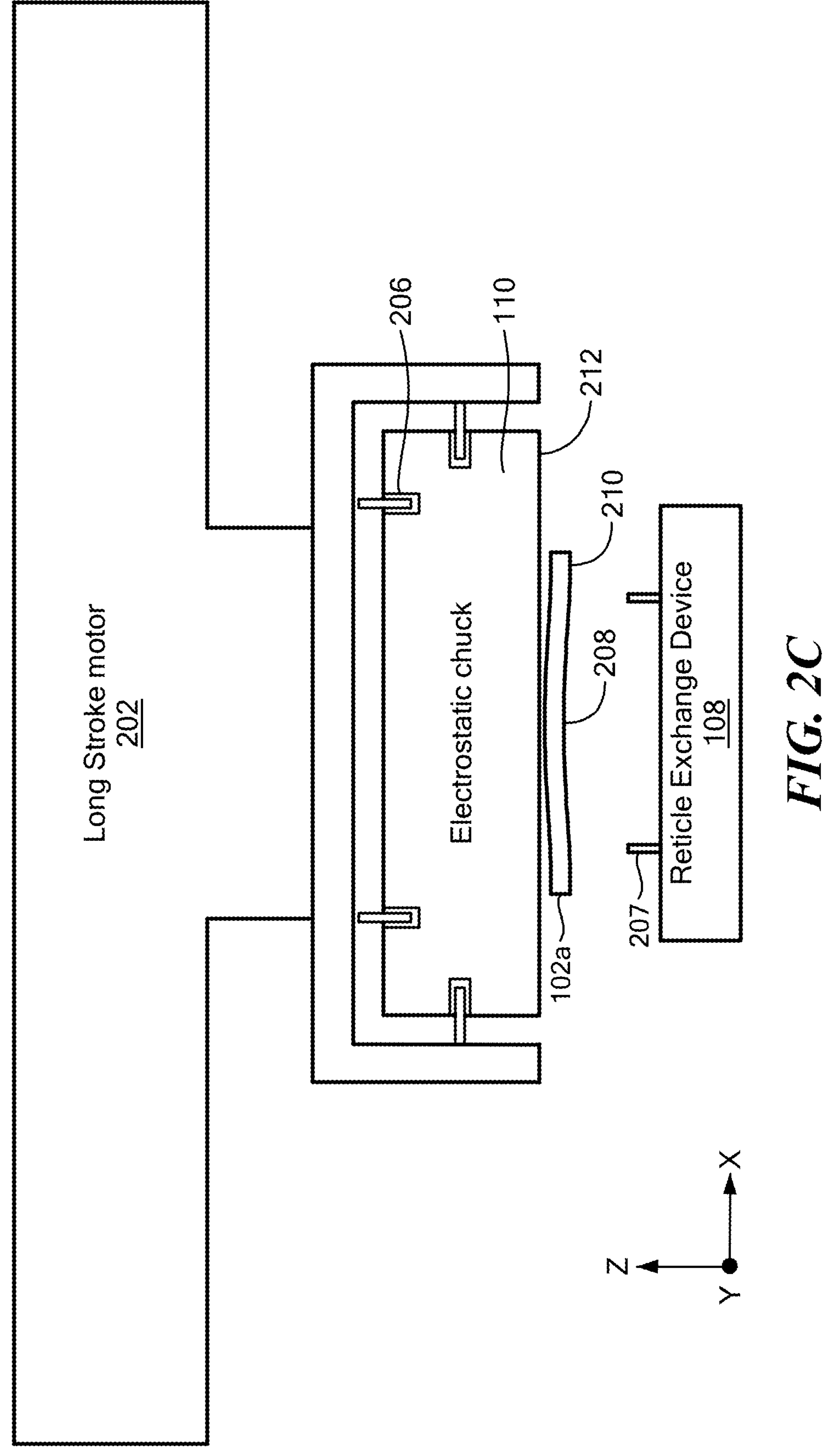

In FIG. 2C, the reticle 102*a* has been aligned and levitated further (relative to its position in FIG. 2B) toward the electrostatic chuck 110 so that the center area 208 is in contact with the clamping surface 212. The edges 210 have not yet made contact with the clamping surface 212 because of the bowed shape of the reticle 102*a* during levitation.

Figure 2D:
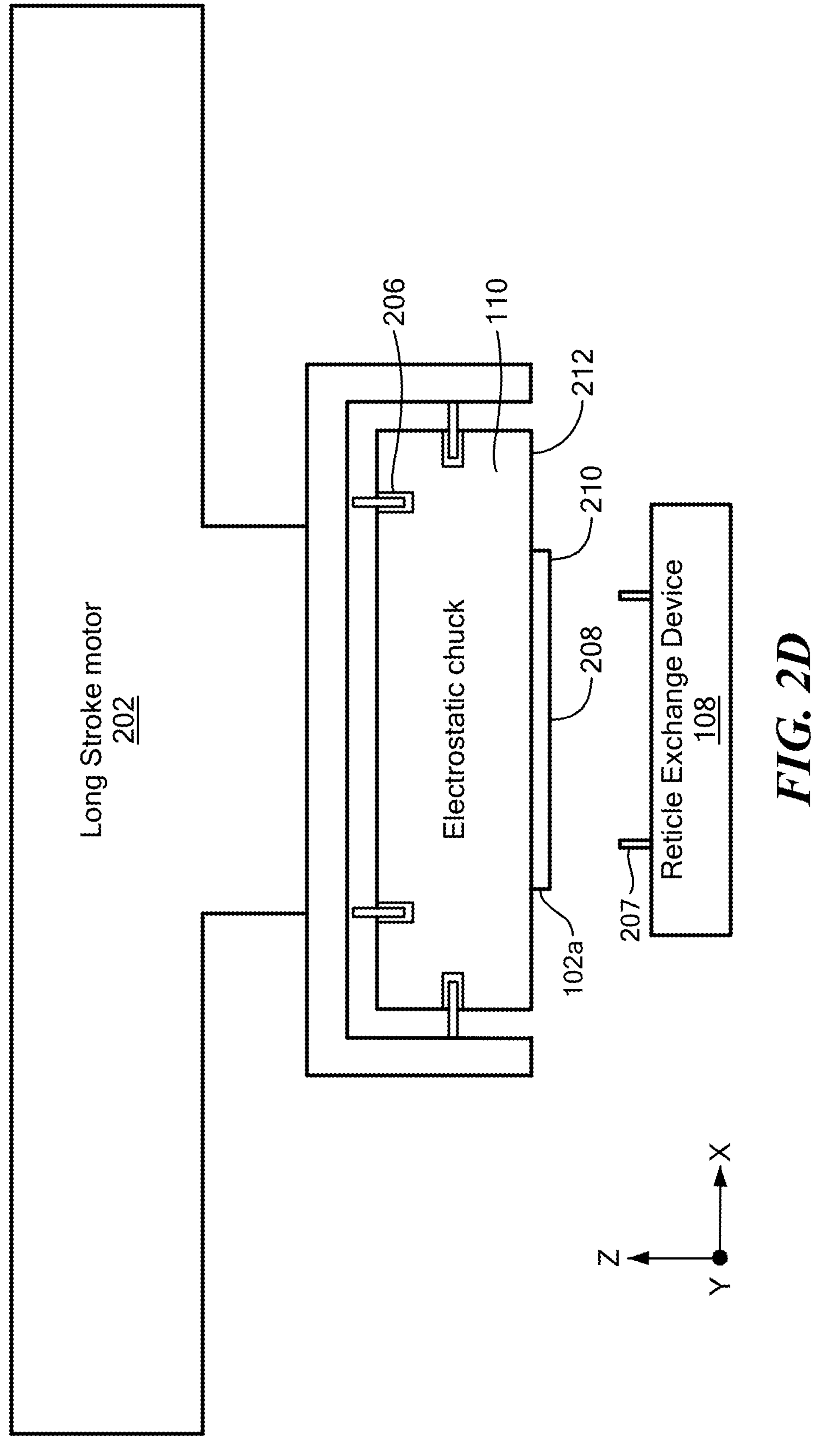

In FIG. 2D, clamping electrodes of the electrostatic chuck 110 are engaged and have electrostatically clamped the reticle 102*a* against the clamping surface 212. The clamping electrodes have pulled the edges 210 of the reticle 102*a* against the clamping surface 212 so the entire body (including the edge areas 210) of the reticle 102*a* is clamped securely to the electrostatic chuck 110.

Figure 3A:
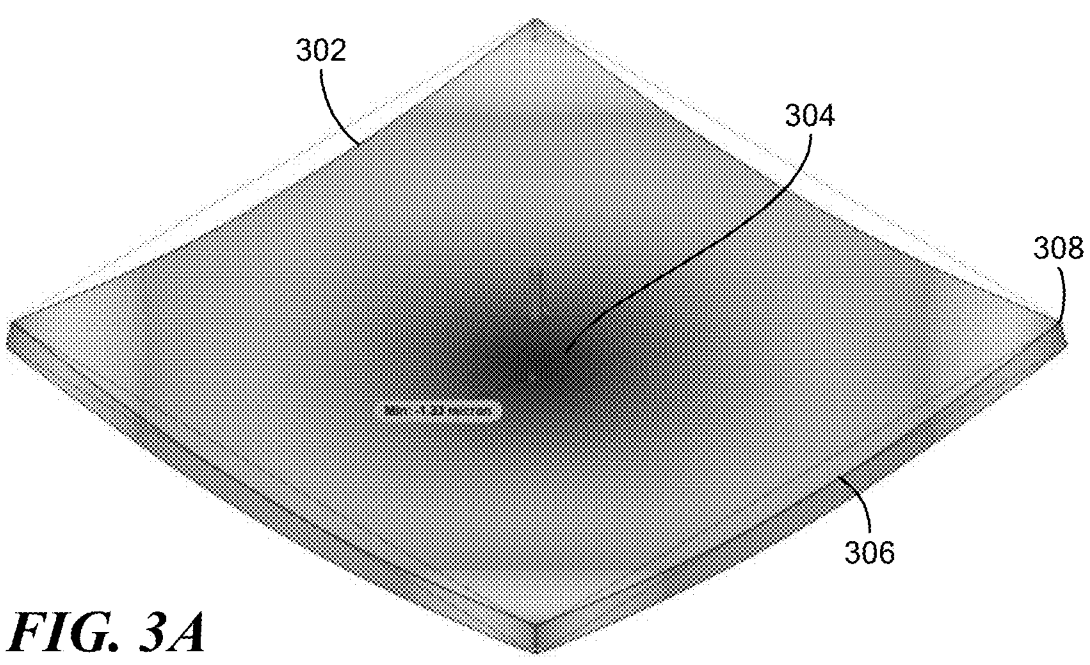
FIG. 3A is an isometric diagram of a reticle that is bowed due to gravity.
Figure 3B:
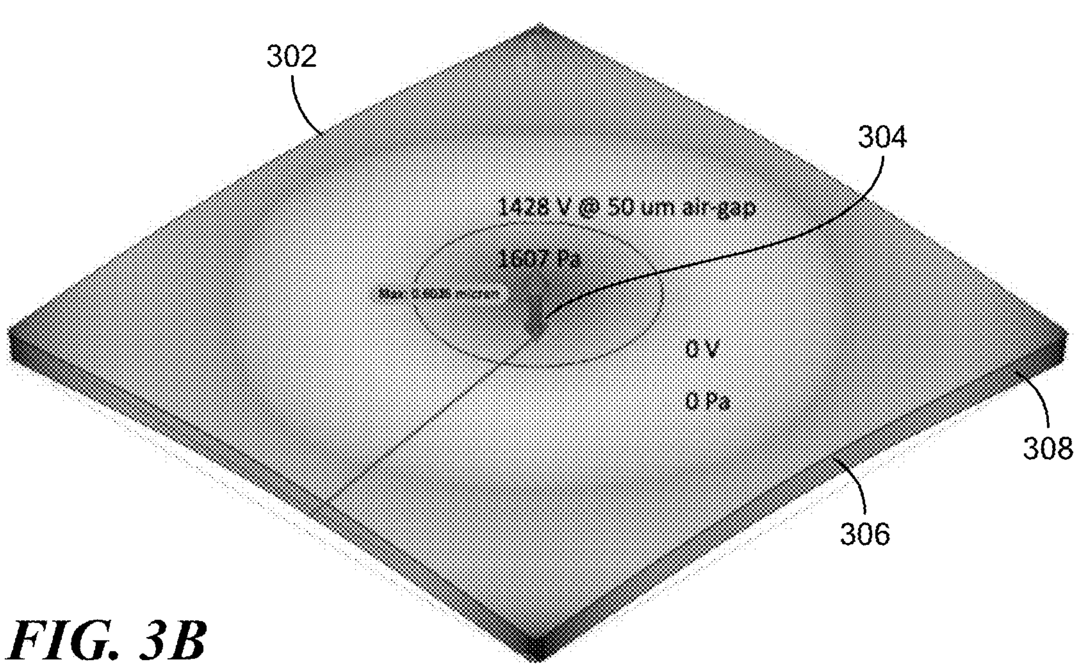
FIG. 3B is an isometric diagram of a reticle that is bowed during electrostatic levitation.

FIGS. 3A and 3B are isometric views showing the bowing of a reticle 302, which may be the same as or similar to reticle 102*a*. In FIG. 3A, the reticle 302 may be positioned on a seat or holder (for example, seat 207) prior to clamping by the electrostatic chuck 110. The center area 304 is pulled down relative to the edge areas 306 and corners 308 by gravity. In embodiments, and depending on the reticle material and size, the center area 304 may be about 1 μm lower than the edge areas 306 and/or the corner areas 308.

The deflection shape shown in FIG. 3A may be caused by the reticle 102*a* resting on a seat 207 that has pins located at each of the four corners of the reticle 102*a*. One skilled in the art will recognize that the shape of the bow may differ depending on the type of seat 207 where the reticle 102*a* rests. For example, a seat with three pins that hold the reticle 102*a* may cause a different bow shape.

FIG. 3B shows the shape of reticle 302 during levitation. While levitated, the center area 304 is pulled upward by the electrostatic levitation force and the edge areas 306 and corner areas 308 are pulled downward by the force of gravity. This results in the center area 304 being higher (e.g. close to the clamping surface 212 of the electrostatic chuck 110) than the edge areas 306 and the corner areas 308. Thus, as reticle 302 moves toward and is clamped by the electrostatic chuck 110, the center area 304 will contact the electrostatic chuck before the edge areas 306 and the corner areas 308.

In embodiments, the electrostatic force acts on the entire reticle 102*a* to compensate for the force of gravity. The electrostatic pressure may be concentrated at or near the center of the reticle to create the bow. Gravity, being a body force, on the other hand, acts uniformly throughout the body of the reticle 102*a*. During levitation, the total upwards electrostatic force is about equal to the total downwards force on the reticle due to gravity, and the concentrated electrostatic force near the center area 304 may create the upward bow shape shown in FIG. 3B.

In embodiments, the electrodes of the electrostatic chuck 110 may be configured to twist the body of the reticle 102*a* so that, for example, two opposite corners or the reticle 102*a* are twisted up and the other two opposite corners of the reticle 102*a* are twisted down.

Figure 4:
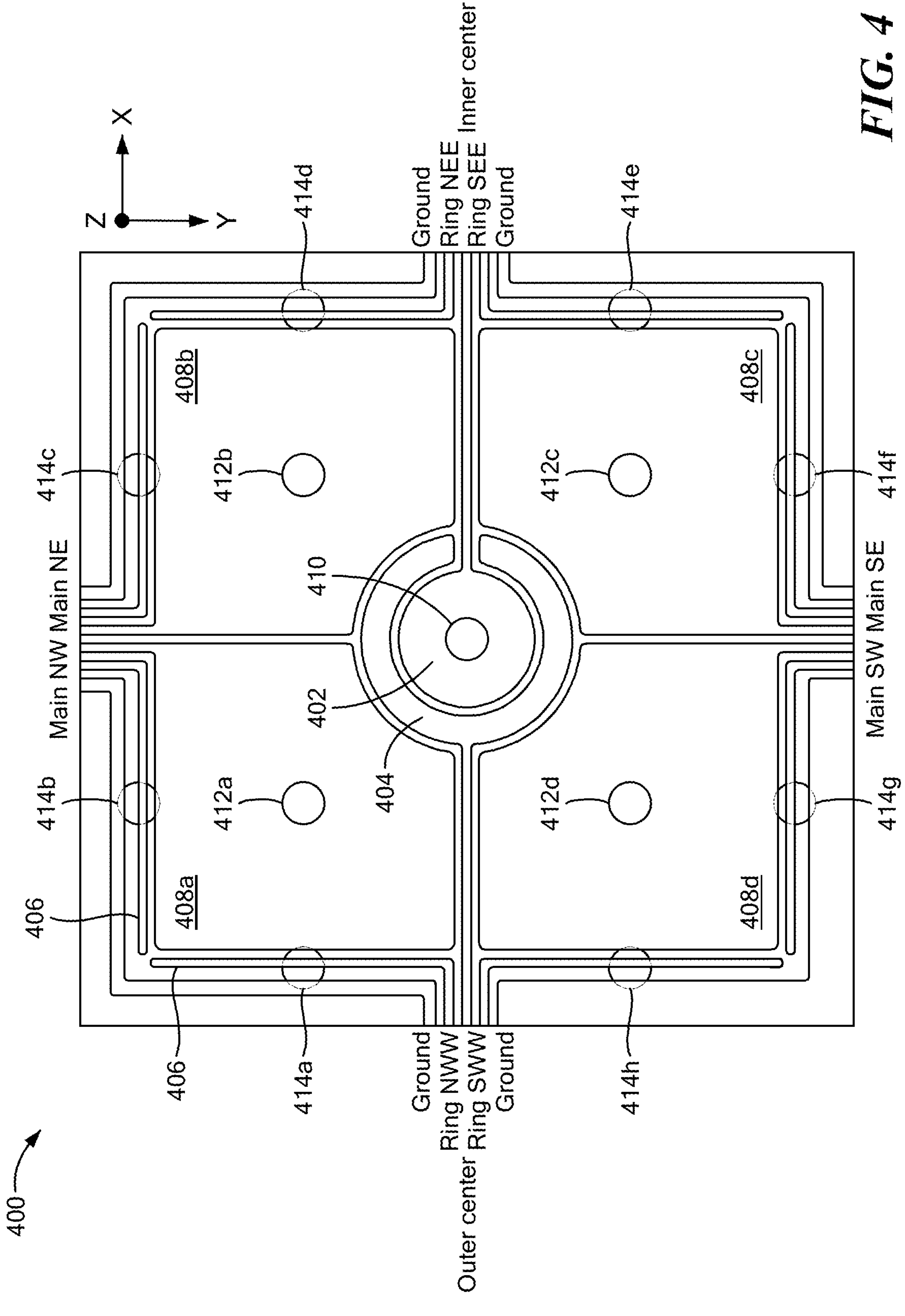
FIG. 4 is a diagram of a sensor and electrode assembly of an electrostatic chuck.

FIG. 4 is a diagram of a sensor and electrode assembly 400, which may be coupled to an electrostatic chuck (e.g. electrostatic chuck 110). Although not shown in this figure, a control circuit (such as control circuit 120 in FIG. 1) may be coupled to the electrodes and sensors to control and sense the position of the reticle 102*a* during the clamping process. The control circuit may control voltage, current, and/or power circuits that drive the electrodes and may be coupled to receive data measurements from the sensors that can be used to determine the position of the reticle 102*a*.

In embodiments, the assembly 400 may be located on or near the clamping surface 212 of the electrostatic chuck 110. In the embodiment shown, the assembly includes an inner center electrode 402 and an outer center electrode 404 located in the center of assembly 400. Modulating the voltage of the inner center electrode 402 and/or the outer center electrode 404 may provide at least a portion of the levitating force to lift the reticle 102*a* and may control the bow of the reticle 102*a* while it is levitated. For example, the inner and outer center electrodes 402, 404 may provide a lifting force in the center area 208 of the reticle 102*a*. The lifting force, concentrated in the center area 208, pulls the reticle 102*a* up by the center and allows gravity to pull the corners and edges of the reticle 102*a* down, resulting in the bow shape shown in FIG. 3B.

The assembly 400 also includes one or more main electrodes 408*a-d* that provide the main force for levitating the reticle 102*a* in the Z direction. By modulating the voltage of electrodes 408*a-d*, the control circuit 120 can lift and replace the reticle 102*a* from its seat 207. Also, by modulating one or more of the main electrodes 408*a-d* more strongly than the other main electrodes, the control circuit control the tilt of the reticle 102*a* to control its position during clamping.

One or more circumference electrodes 406 may be positioned around or near the edges of assembly 400 to control the position of the reticle 102*a* in the X and Y direction. The circumference electrodes 406 may be placed on or near the periphery of the assembly and may partially or completely surround the assembly. By modulating the voltage applied to electrodes 406 the control circuit 120 can control position in the X and Y coordinates as well as yaw (e.g. twisting or rotation in the XY plane) of the reticle 102*a*.

The assembly 400 also includes one or more sensors to detect the position and orientation of the reticle 102*a*, as well as detect contact between the reticle 102*a* and the electrostatic chuck 110. A central sensor 410 can detect the shape (i.e. the bow described above) of the reticle 102*a* and may also detect contact between the center area 208 of the reticle 102*a* and the electrostatic chuck 110.

One or more vertical position sensors 412*a-d* may be located at a predetermined distance from the center sensor 410. These sensors 412*a-d* may be configured to detect the position of the reticle 102*a* in the Z axis, i.e. the proximity of the reticle 102*a* to the clamping surface 212 of the electrostatic chuck 110. The vertical position sensors 412*a-d* may also be able to detect tilt of the reticle 102*a* during levitation. For example, if sensor 412*a* and 412*c* detect a different proximity of the reticle 102*a*, this could indicate that one corner of the reticle 102*a* is higher than another. In embodiments, there are the same number of vertical position sensors 412*a-d* as there are main electrodes 408*a-d*. The vertical position sensors 412*a-d* may be located within or near each associated main electrode 408*a-d*. However, in other embodiments, there number of sensors and the number of electrodes may differ.

The assembly 400 also includes one or more horizontal position sensors 414*a-h* to detect the position and yaw of the reticle 102*a* in the X and Y axes. For example, if sensors 414*d* and 414*e* (on the right side of FIG. 4) sense a relatively close proximity of the reticle 102*a* and the sensors 414*a* and 414*h* (on the left side of FIG. 4) sense a relatively distant proximity of the reticle 102*a*, this may indicate that the reticle is positioned right of center with respect to the assembly 400.

Any or all of the proximity sensors may be eddy current sensors (that detect an eddy current in the reticle), or any other type of proximity sensors including, but not limited to, sonic sensors, photoeye sensors, inductive sensors, capacitive sensors, IR sensors, photoelectric proximity sensors, magnetic proximity sensors, LiDAR proximity sensors, and the like.

In embodiments, the assembly 400 may be configured for self-sensing actuation where the electrodes for manipulating the position and shape of the reticle 102*a* may double as capacitive position or proximity sensors. In these embodiments, some or all of the dedicated position sensors (such as sensors 412 or 414) may not be required because the electrodes perform position sensing of the reticle 102*a*.

Typically, the electrode assembly 400 will have a size (e.g. width and height) that is about the same or larger than the size of the reticle 102*a* so that the reticle's outer edges are aligned with the outer edges of the ring electrodes 406. This may allow the ring electrodes 406 to stabilize the horizontal position of the reticle 102*a* by creating a DC electric field. In this example, the ring electrodes 406 may also be able to stabilize and/or control the position of the reticle 102*a* by creating an electric field that is active (e.g. an AC or modulated electric field) and/or an electric field that changes in reaction to a change in the position of the reticle 102*a*.

In other embodiments, the electrode assembly 400 will have a size that is larger than the size of the reticle 102*a*. For example, the combined area of the main electrodes 408*a-d* may be about the same as the top surface area of the electrode 102*a*. In this embodiment, the ring electrodes 406 may be positioned outside the edges of the reticle 102*a*. This configuration may be beneficial for situations where the ring electrodes 406 provide active or reactive electric fields to stabilize the horizontal position and/or yaw of the reticle 102*a*. Additionally or alternatively, n this embodiment, the ring electrodes 406 create a DC electric field to stabilize the position of the reticle 102*a*.

Of course, in some instances the size of the assembly 400 may be smaller than the size of the reticle 102*a*.

The electrostatic stress from the electrode on the reticle can be modeled, to first order, as the force between two parallel plate capacitors with one electrode at 0 potential. The normal stress (electrostatic pressure) on the surface of the substrate is then given by:

$$P_{electrostatic=\tau_{z,z}} = \frac{1}{2}\epsilon_0 E^2 = \frac{1}{2}\epsilon_0\left(\frac{V}{z}\right)^2$$

where $\epsilon_0$ is the permittivity of free space, E is the electric field intensity, and z is the distance between the two plates. Since the electric-field lines are assumed generally parallel and normal to the plates, the electric field can be represented as the gradient of a linearly varying potential field (V), i.e. E=V/z.

The electrostatic pressure acting on the exposed surface area balances against the force due to gravity on the reticle

102*a*. The gravitational force density (force per unit-area) due to gravity can be represented by:

$$P_{gravity} = \frac{\rho g t A}{A} = \rho g t,$$

where, ρ is the density of the object being levitated, g is the acceleration due to gravity, t is the thickness of the object, and A is the face area. Note that, as the weight and/or thickness of the reticle 102*a* increases, the minimum electrode voltage required to lift the object may also increase. A typical reticle may, for example, be formed from quartz and have a thickness of about 6.25 mm. The reticle may also include a conductive backing that is used for electrostatic levitation and grasping by the electrostatic chuck.

Figure 5:
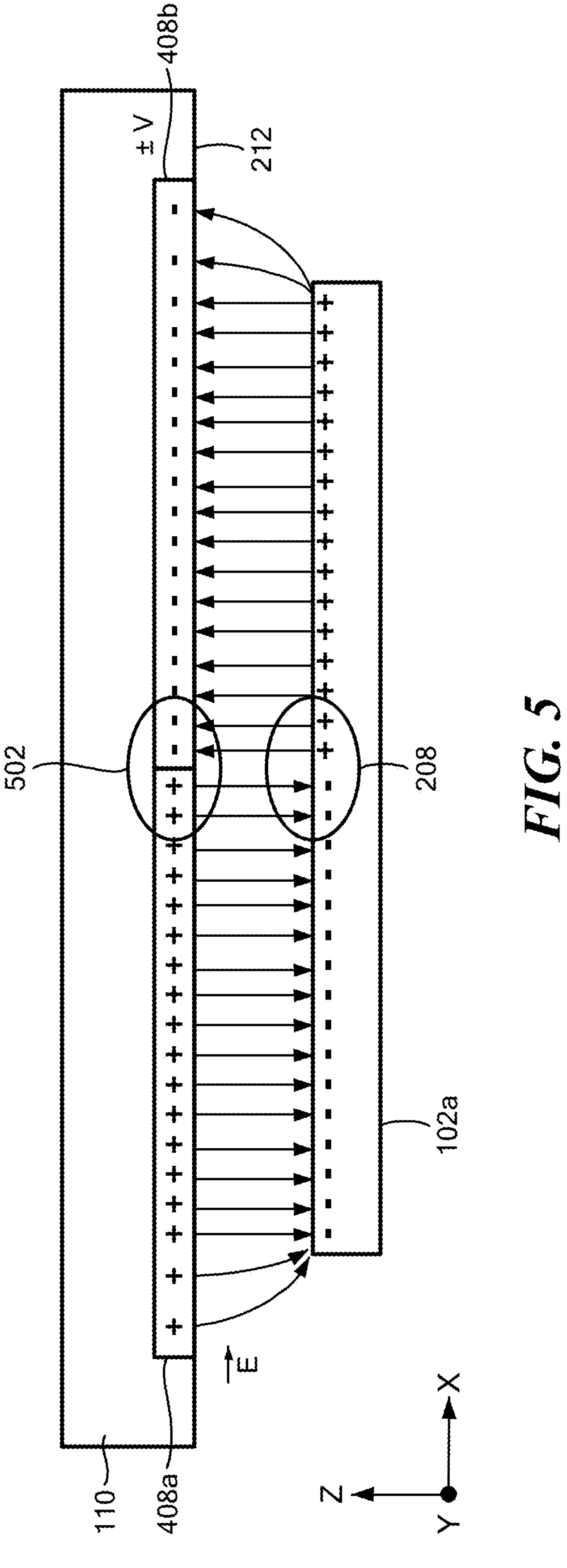
FIG. 5 is a diagram of an electrostatic chuck and reticle showing electrical field lines and charges between the electrostatic chuck and the reticle.

Referring to FIG. 5, electrostatic levitation can induce localized charge within the reticle 102*a*. For example, if a levitation electrode 408*a* has a positive electrical change, it will induce a negative electrical charge in the top surface of the reticle 102*a*. Similarly, if electrode 408*b* has a negative electrical charge, it will induce a positive electrical charge in the top surface of the reticle 102*a*. To avoid electrostatic discharge when the reticle 102*a* makes contact with the clamping surface 212 of the electrostatic chuck 110, the control circuit 120 may drive the electrodes with opposite voltage. As a result, as shown in FIG. 5, the top surface of the reticle 102*a* has an area of induced positive charge (due to electrode 408*b*) and an area of induced negative charge (due to electrode 408*a*). Thus, the net charge on the top surface of reticle 102*a* may be about zero Volts. Significantly, using this technique, the center area 408 of the reticle 102*a* may be located between the localized areas of positive and negative charge. This results in reduced chance for electrostatic discharge because the center area, which makes first contact with the electrostatic chuck 110 as described above, has a voltage of about zero Volts and the center area 502 of the clamping surface 212 of the electrostatic chuck 110 that makes first contact with the reticle 102*a* also has a voltage of about zero Volts.

In embodiments, to maintain a net zero charge on the reticle, the electrostatic chuck 110 may include at least 2*N electrodes, where N is the rigid and flexible degrees of freedom required. For example, in the situation where the electrostatic chuck controls the reticle 102*a* with six degrees of freedom, the electrostatic chuck may include at least 2*6=12 electrodes. In this example, each degree of freedom may be controlled by two electrodes that can be charged with opposite polarities in order to maintain a net zero charge on the reticle 102*a*.

As the reticle 102*a* levitates, it may undergo lateral motion in the X and Y directions. In some cases, the reticle 102*a* may oscillate in the X and Y directions as the electrostatic lifting force and downward force of gravity each pull on the reticle 102*a*. The lateral motion may dampen slowly in an air environment (where there is little friction to stop the motion) or in a vacuum environment (where there is close to zero friction to stop the motion). Thus, various techniques may be used to dampen the lateral motion prior to clamping by the electrostatic chuck 110.

It may be desirable for the relative horizontal velocity between the electrostatic chuck 110 and the reticle 102*a* be about 0 to avoid shear during clamping, which can cause wear and tear to the reticle and/or electrostatic chuck. When levitated, the reticle 102*a* has a horizontal velocity component due (at least in part) to relative vibration between the seat 207 and the electrostatic chuck 110. The reticle oscillates in the horizontal direction due, at least in part, to the positive stiffness in the horizontal direction from the electrodes of the electrostatic chuck. The electric fields generated by the ring electrodes (e.g. electrodes 406 in FIG. 4) provide a restoring force that tends to center the reticle 102*a* during levitation. The restoring force may increase as the position of the deviates from center.

Figure 6A:
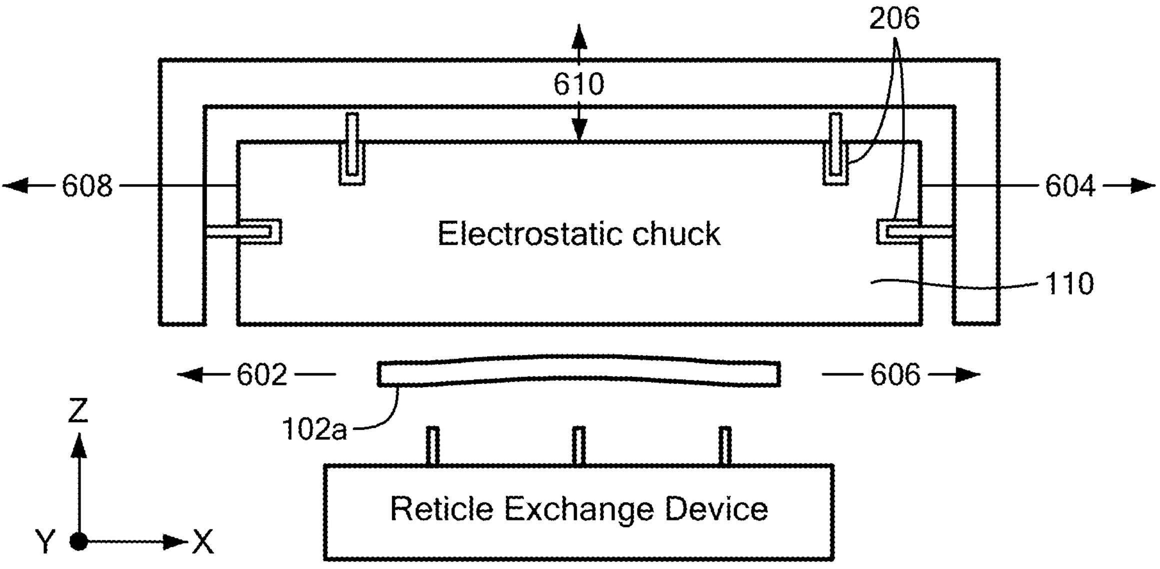
FIG. 6A is a diagram of an electrostatic chuck and levitating reticle.
Figure 6B:
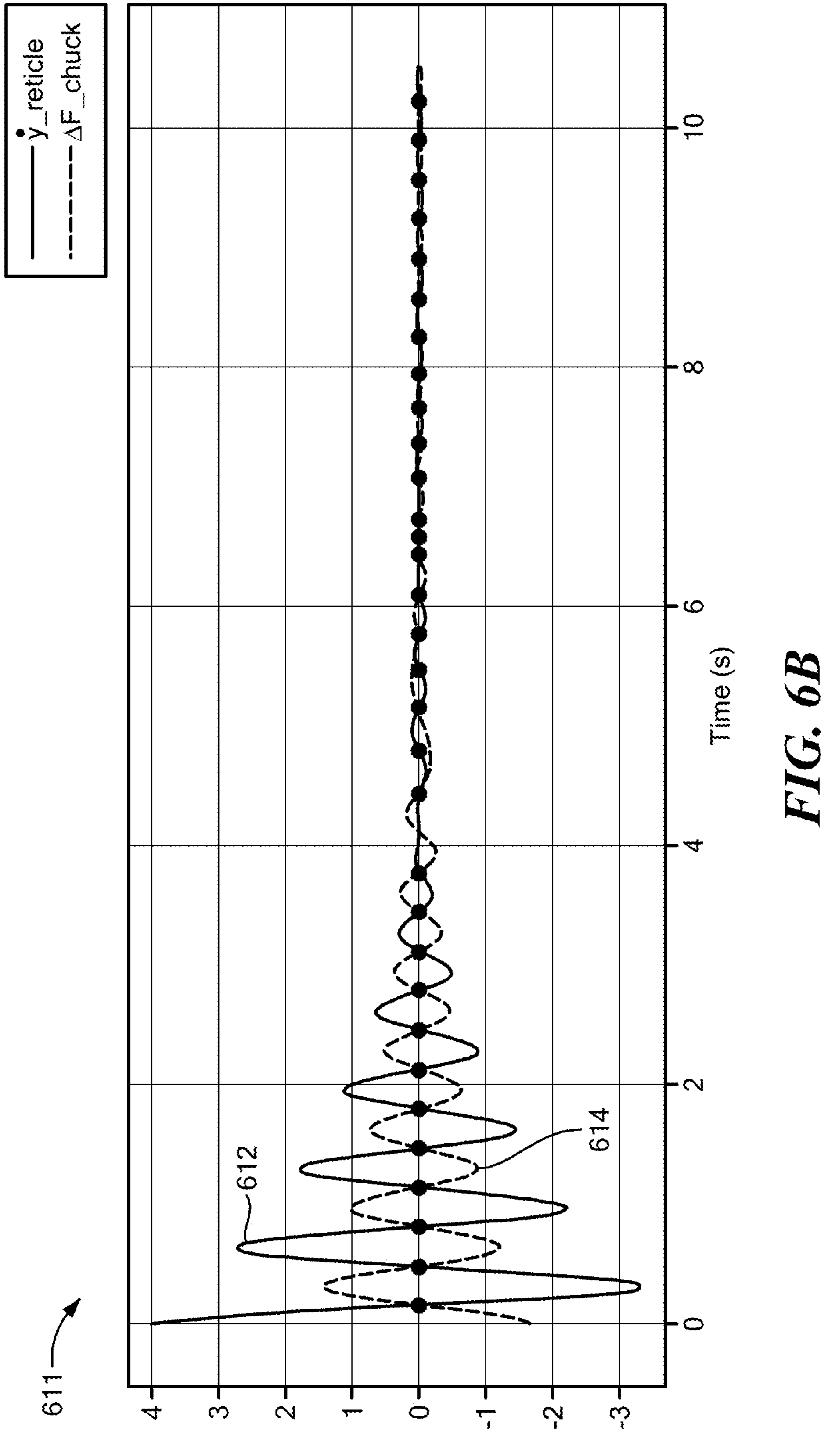
FIG. 6B is a graph of horizontal position over time of the electrostatic chuck and reticle of FIG. 6A.

FIGS. 6A and 6B illustrate a method that can be used to further damp the lateral motion of the reticle 102*a* using motor control of the position of the electrostatic chuck 110. As the reticle 102*a* moves in the negative X direction (indicated by arrow 602), the control circuit 120 may cause the motors 206 to move the electrostatic chuck 110 in the positive X direction (indicated by arrow 604) to create a pulling force in the direction opposite the reticle's motion. The pulling force may be caused by the electrostatic forces (e.g. Coulomb forces) between the electrodes of the electrostatic chuck 110 and the reticle 102*a*. Similarly, as reticle 102*a* moves in the positive X direction (indicated by arrow 606), the control circuit 120 may case the motors 206 to move the electrostatic chuck 110 in the negative X direction (indicated by arrow 608). Additionally or alternatively, the control circuit 120 may cause the motors 206 to move the electrostatic chuck 110 in the positive and negative Y direction (as indicated by arrow 610) which may also dampen motion of the reticle 102*a* in the X direction.

FIG. 6B is a graph 611 showing the position of the electrostatic chuck 110 (indicated by waveform 612) and the position of the reticle 102*a* (indicated by waveform 614) over time during the damping process. In graph 611, the vertical axis represents position in the X direction and the horizontal axis represents time. The control circuit, in response to readings from the sensors (e.g. sensors 414 in FIG. 4) that indicate the position of the reticle 102*a*, controls the position and displacement of the electrostatic chuck to create a dampening force on the reticle 102*a*. In this example, after about 8 seconds the reticle 102*a* may be centered and motion in the X direction has stopped.

Additionally or alternatively, other motions of the electrostatic chuck 110 may be used to stabilize the horizontal position of the reticle 102*a*. In one example, the electrostatic chuck 110 may move in the horizontal direction along with the reticle just after levitation is achieved and maintain that velocity throughout levitation until clamping such that the relative velocity between them is zero.

Figure 6C:
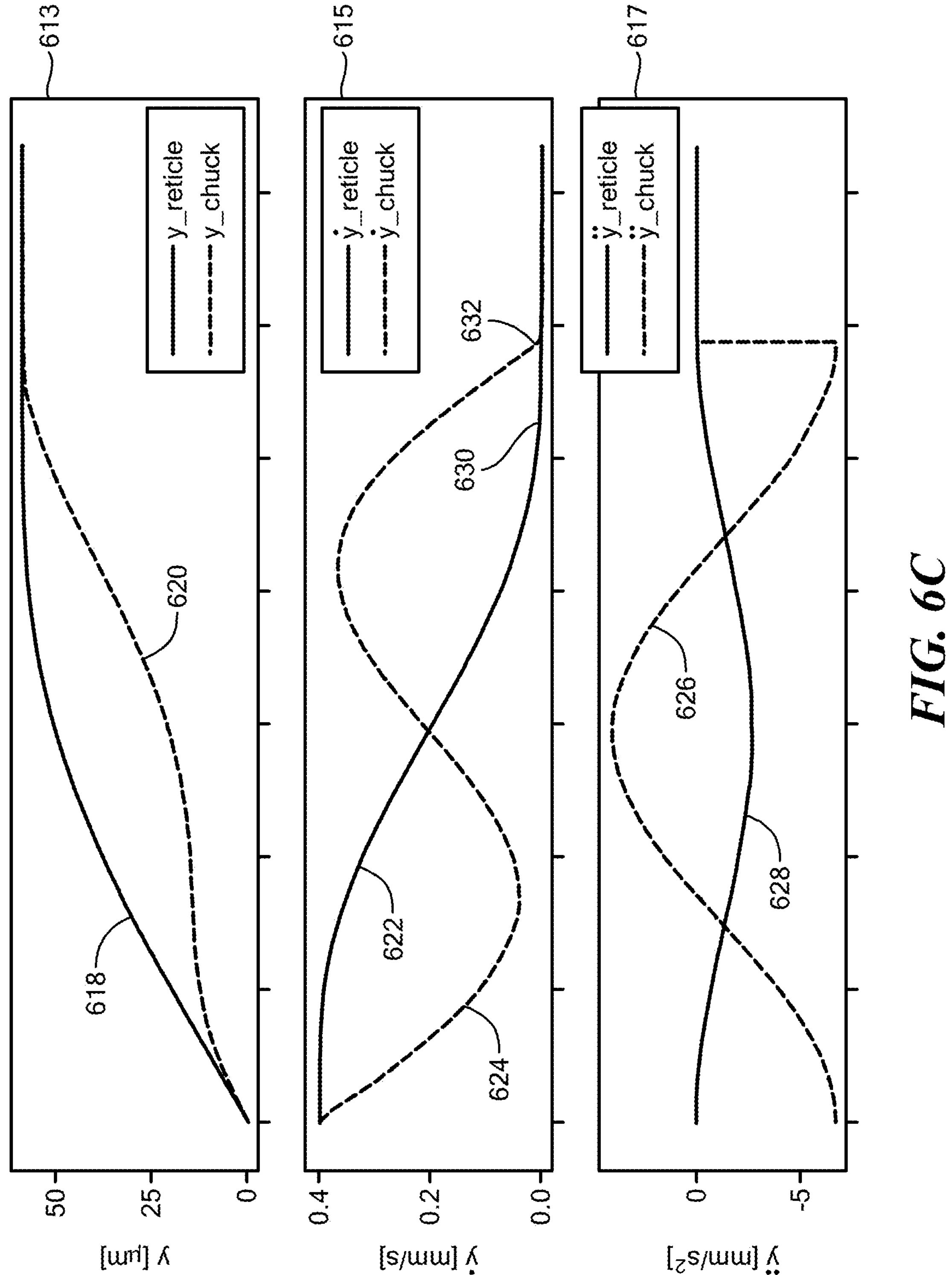
FIG. 6C is a series of three graphs showing motion of the electrostatic chuck and reticle.

FIG. 6C includes three graphs 613, 615, and 617 that illustrate another method that can be used to dampen horizontal motion of the reticle 102*a*. In each graph 613, 615, and 617 the horizontal axis represents time. In graph 613, the vertical graph represents displacement. In graph 615, the vertical graph represents velocity. And in graph 617, the vertical graph represents acceleration. Waveforms 620, 624, and 626 represent the displacement, velocity, and acceleration of the electrostatic chuck 110, respectively, and waveforms 618, 622, and 628 represent the displacement, velocity, and acceleration of the reticle 102*a*, respectively. As shown in graphs 613, 615, and 617, the electrostatic chuck 110 can be moved in a single, smooth trajectory (i.e. a continuous trajectory without a change in direction) that can reduce the horizontal velocity of the reticle 102*a* to about zero at about point 630. Once the velocity of the reticle 102*a* reaches about zero, the electrostatic clamp 110 can clamp the reticle 102*a* at point 632.

Additionally or alternatively, as the reticle 102*a* is oscillating, the electrostatic clamp 110 can clamp the reticle 102*a* at a point in time during the oscillation when the velocity of the reticle 102*a* is about zero. In this instance, control circuit 120 can detect (via position sensors) when the horizontal velocity of the reticle 102*a* is at zero and cause the electrostatic chuck 110 to clamp the reticle 102*a* at that time.

Figure 7A:
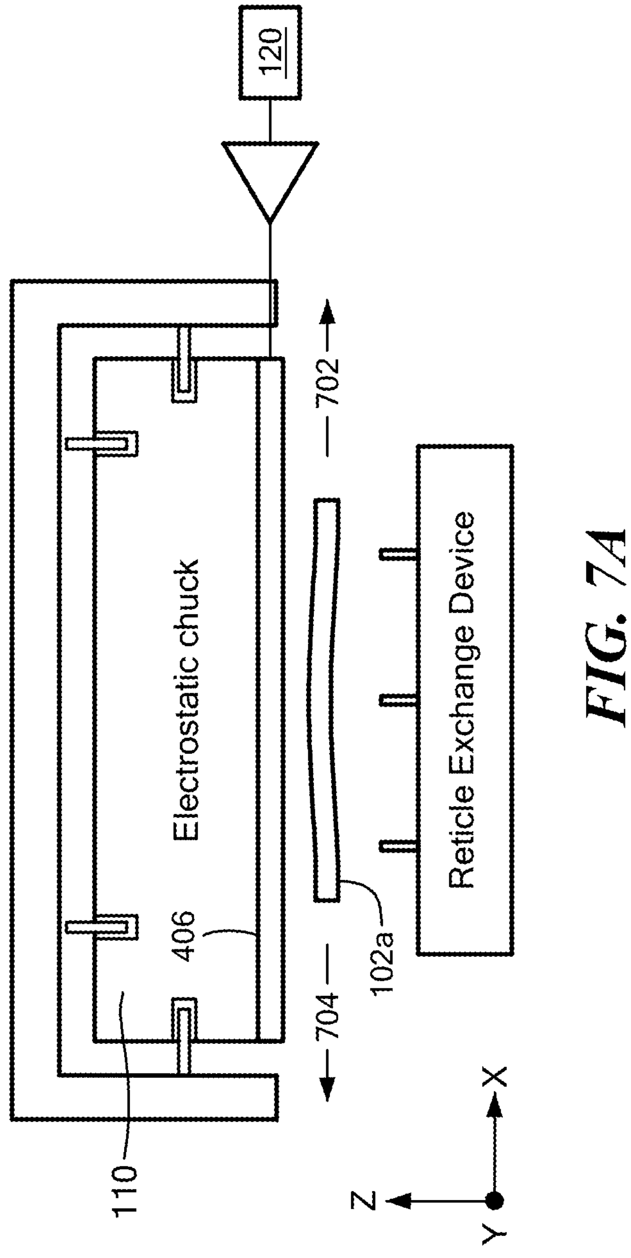
FIG. 7A is a diagram of an electrostatic chuck and levitating reticle.
Figure 7B:
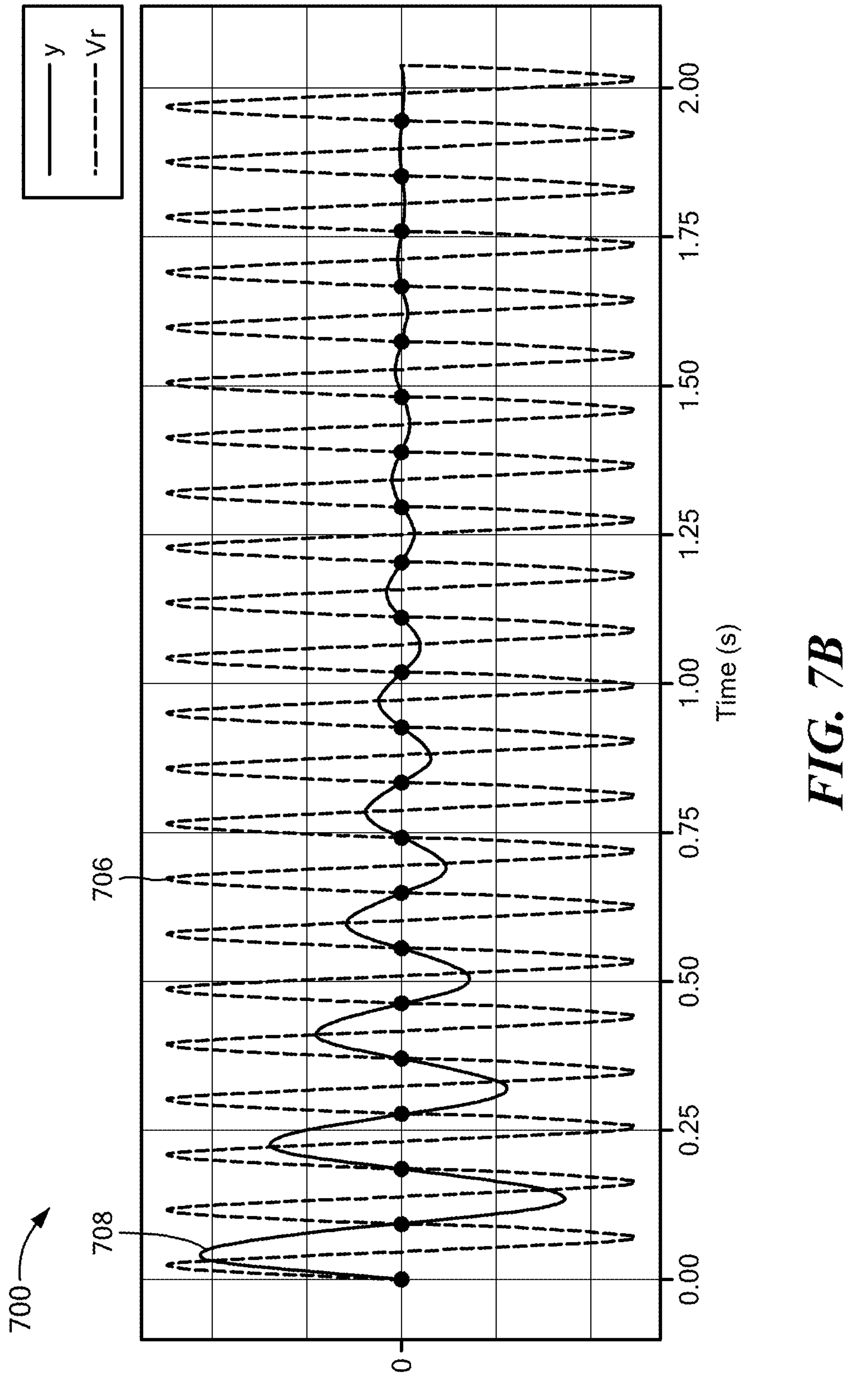
FIG. 7B is a graph of horizontal position of the reticle and activation of an electrode of the electrostatic chuck of the electrostatic of FIG. 7A.

Referring to FIGS. 7A and 7B, the electrodes 406 may also be used to dampen lateral motion of the reticle 102*a*. As the reticle 102*a* moves away from the center position in the X or negative X direction (indicated by arrows 702 and 704, respectively), the control circuit 120 may modulate the voltages one or more of the electrodes 406 to create an electrostatic pulling force that pulls the reticle back toward the center position. In embodiments, a feedback loop may be coupled between the position sensors of the electrostatic chuck 110 and the control circuit 120 so that the control circuit 120 may modulate the voltages of the electrodes in response to the position of the reticle 102*a*.

FIG. 7B is a graph 700 showing the position of reticle 102*a* in the X axis (indicated by waveform 708) and the voltage applied to at least one of the electrodes 406 (indicated by waveform 706). The horizontal axis represents time and the vertical axis represents both voltage (with respect to the voltage waveform 706) and physical displacement (with respect to the reticle position waveform 708). As the reticle 102*a* moves away from center, a voltage is applied to the electrodes. This creates an electrostatic force between the electrode and the reticle that is in opposition to the motion of the reticle 102*a*. The electrostatic pulling force dampens the oscillation of the reticle 102*a* until, after about 1.75 seconds in this example, when the reticle 102*a* is substantially centered and still. In embodiments, the frequency of the voltage waveform 706 may be about twice the frequency of the reticle's oscillations.

Since the horizontal forces from the ring electrodes (e.g. electrodes 406) are generally independent of the vertical forces exerted by the levitation electrodes, the lateral damping actuation can be carried out independent of vertical motion.

For ease of illustration, the lateral motion in FIGS. 6A, 6B, 7A, and 7B is described with respect to the X direction. One skilled in the art will recognize that the motion dampening techniques described above can also be used to dampen motion of the reticle 102*a* in the Y direction.

The descriptions above use examples relating to electrostatic chucks, electrostatic levitation, and a specific fabrication process. However, one skilled in the art will recognize that the systems and techniques described here may be used in various other applications and with various alterations. For example, the systems and techniques are not limited to reticles used in silicon wafer manufacturing. Rather, they are application to any object or workpiece that can be held by an electrostatic chuck. Additionally, the levitation technique is not necessarily specific to electrostatic chucks. It can be used with magnetic chucks, mechanical chucks, mechanical vices or grips, or any applicable device that can pick an object up. Different forms of levitation can also be used. For example, the reticle (or any workpiece) can be levitated using magnetic levitation, pneumatic levitation, etc. Also, the systems and techniques are not limited to being used in a silicon wafer manufacturing process. They can be used for any application where an object is picked up by a chuck, robot arm, or other mechanism. Furthermore, the electrodes and/or sensors described above do not need to be located on the electrostatic chuck. They could be separate from the electrostatic chuck (for example, on the reticle exchange device 108), as long as they are positioned so they can levitate and sense the reticle.

Various embodiments of the concepts, systems, devices, structures, and techniques sought to be protected are described above with reference to the related drawings. Alternative embodiments can be devised without departing from the scope of the concepts, systems, devices, structures, and techniques described. It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture or an article, that comprises a list of elements is not necessarily limited to only those elements but can include other elements not expressly listed or inherent to such apparatus, method, composition, mixture, or article.

Additionally, the term "exemplary" is means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e. one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether or not explicitly described.

Relative or positional terms including, but not limited to, the terms "upper," "lower," "right," "left," "vertical," "horizontal," "top," "bottom," and derivatives of those terms relate to the described structures and methods as oriented in the drawing Figures. The terms "overlying," "atop," "on top," "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

The invention claimed is:

1. A system for exchanging a reticle in a semiconductor processing system, the system for exchanging the reticle comprising:

a reticle exchange device having a seat for a reticle; and an electrostatic chuck having at least one clamping surface and one or more clamping electrodes for electrostatically clamping the reticle against the clamping surface;

a plurality of levitation electrodes to electrostatically levitate the reticle prior to contact with the clamping surface of the electrostatic chuck; and a control circuit configured to modulate voltage of different ones of the levitation electrodes to control position and orientation of the reticle in six degrees of freedom while maintaining substantially net zero charge on the reticle, wherein the control circuit is further configured to induce a convex geometric deformation in the reticle during levitation such that a center area of the reticle makes contact with the clamping surface prior to edge areas of the reticle.

2. The system of claim 1 wherein the levitation electrodes are positioned on the electrostatic chuck.

3. The system of claim 2 wherein the levitation electrodes are configured to also act as clamping electrodes.

4. The system of claim 1 wherein the levitation electrodes are configured to control motion trajectory, position, shape, contact location, contact forces, and orientation of the reticle.

5. The system of claim 1 wherein the levitation electrodes are configured to control position and orientation of the reticle with six degrees of freedom.

6. The system of claim 1 wherein the levitation electrodes are configured to shape the reticle so that a center area of the reticle is closer to the electrostatic chuck than one or more corners of the reticle during levitation.

7. The system of claim 1 further comprising one or more sensors to detect a position and orientation of the reticle.

8. The system of claim 7 wherein the one or more sensors and the levitation electrodes are the same.

9. The system of claim 7 wherein the levitation electrodes comprise an electrode to control horizontal positioning of the reticle, an electrode to control vertical positioning of the reticle, and/or an electrode to control a shape of the reticle.

10. The system of claim 7 wherein the one or more sensors are configured to detect the position of and orientation of the reticle in six degrees of freedom and/or detect a shape of the reticle.

11. The system of claim 1 wherein the one or more levitation electrodes are configured to dampen lateral motion of the reticle during levitation.

12. The system of claim 1 further comprising:

one or more motors coupled to the electrostatic chuck to control a position of the electrostatic chuck; and a motor control circuit coupled to control the one or more motors.

13. The system of claim 12 wherein the motor control circuit is configured to dampen lateral motion of the reticle during levitation by controlling the position of the electrostatic chuck.

14. An electrostatic chuck comprising:

a surface configured to receive a workpiece;

one or more clamping electrodes configured to electrostatically attract and clamp the workpiece across an air gap against the surface;

a plurality of levitation electrodes to electrostatically levitate the workpiece prior to clamping;

one or more position sensors to detect a position of the workpiece during levitation; and a circuit coupled to at least one of the one or more clamping electrodes and/or levitation electrodes, the circuit configured to control levitation and clamping of the workpiece, the levitation control including modulating voltage of different ones of the levitation electrodes to control position and orientation of the workpiece in six degrees of freedom while maintaining substantially net zero charge on the workpiece, the circuit further configured transition the workpiece from a first state wherein a center area of the workpiece is even with or lower than edge areas of the workpiece to a second state wherein the center area of the workpiece is actively bowed up above the edge areas of the workpiece prior to the clamping.

15. The electrostatic chuck of claim 14 wherein the one or more levitation electrodes are configured to also act as clamping electrodes.

16. The electrostatic chuck of claim 14 wherein the one or more levitation electrodes are configured to control motion trajectory, position, and orientation of the workpiece with six degrees of freedom during levitation.

17. The electrostatic chuck of claim 14 wherein the one or more levitation electrodes are configured to change a shape of the workpiece so that center area of the workpiece is closer to the surface than an edge and/or corner area of the workpiece.

18. The electrostatic chuck of claim 14 wherein the one or more position sensors are configured to detect a shape of the workpiece.

19. The electrostatic chuck of claim 14 wherein the one or more levitation electrodes are configured to dampen motion of the workpiece during levitation.

20. The electrostatic chuck of claim 14 further comprising:

one or more motors coupled to the electrostatic chuck to control a position of the surface; and a motor control circuit coupled to control the one or more motors.

21. The electrostatic chuck of claim 20 wherein the motor control circuit is configured to dampen motion of the workpiece during levitation by controlling the position of the electrostatic chuck.

22. The electrostatic chuck of claim 14 wherein the circuit is configured to dampen motion of the workpiece by providing an electronic signal to at least one electrode of the clamping electrodes and/or the levitation electrodes that causes the at least one electrode to create electrostatic forces that reduce a lateral motion of the workpiece.

23. A system for exchanging a reticle in a production system, the system for exchanging the reticle comprising:

a reticle exchange device having a seat for a photolithographic reticle;

an electrostatic chuck having a surface and one or more electrodes for electrostatically clamping the photolithographic reticle; and a levitation system comprising a control circuit configured to levitate the photolithographic reticle toward the surface of the electrostatic chuck while controlling position and orientation of the photolithographic reticle in six degrees of freedom and maintaining substantially net zero charge on the reticle, wherein the control circuit is further configured to deform a shape of the photolithographic reticle during the levitation such that a center area of the reticle makes contact with the electrostatic check prior to edge areas of the photolithographic reticle making contact with the electrostatic chuck.

24. The system of claim 23 further comprising means for damping lateral motion of the reticle prior to clamping by the electrostatic chuck.

25. A system for exchanging a photolithographic reticle in a photolithographic production system, the system for exchanging the photolithographic reticle comprising:

a reticle exchange device having a seat for a photolithographic reticle;

an electrostatic chuck having a surface and one or more clamping electrodes for electrostatically clamping the photolithographic reticle; and a levitation system for levitating the photolithographic reticle toward the surface of the electrostatic chuck, the levitation system including:

a plurality of levitation electrodes to levitate the photolithographic reticle prior to clamping by the electrostatic chuck; and a circuit configured to modulate voltage of different ones of the levitation electrodes to control position and orientation of the photolithographic reticle in six degrees of freedom while maintaining substantially net zero charge wherein the plurality of levitation electrodes comprises an inner center electrode for vertical positioning and an outer center electrode driven to provide a restoring force to center the photolithographic reticle during the levitation.

* * * * *